(12) United States Patent
Tanaka

(10) Patent No.: US 6,906,374 B2
(45) Date of Patent: Jun. 14, 2005

(54) SEMICONDUCTOR DEVICE

(75) Inventor: Yoshinori Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/388,624

(22) Filed: Mar. 17, 2003

(65) Prior Publication Data

US 2004/0051127 A1 Mar. 18, 2004

(30) Foreign Application Priority Data

Sep. 18, 2002 (JP) ........................................ 2002-271700

(51) Int. Cl.$^7$ ........................................ H01L 21/8242
(52) U.S. Cl. ........................................ 257/306; 257/307
(58) Field of Search ........................ 257/300–311, 295

(56) References Cited

U.S. PATENT DOCUMENTS

| 5,851,870 | A | * | 12/1998 | Alugbin et al. ............. 438/239 |
| 6,130,126 | A | * | 10/2000 | Iwakiri ........................ 438/253 |
| 6,175,130 | B1 | | 1/2001 | Hosotani et al. |
| 6,362,042 | B1 | | 3/2002 | Hosotani et al. |
| 6,368,910 | B1 | | 4/2002 | Sheu et al. |
| 6,534,375 | B2 | * | 3/2003 | Iijima et al. ................. 438/386 |
| 6,605,530 | B2 | * | 8/2003 | Nakamura et al. .......... 438/627 |
| 2004/0075132 | A1 | * | 4/2004 | Lee ............................. 257/309 |

FOREIGN PATENT DOCUMENTS

| JP | 2001-339050 | 12/2001 |
| KR | 1998-070626 | 10/1998 |

* cited by examiner

Primary Examiner—H. Jey Tsai
(74) Attorney, Agent, or Firm—McDermott Will & Emery LLP

(57) ABSTRACT

A semiconductor device without any peel off from the insulation film and without any fracture that becomes the cause of a short circuit is obtained even if a metal such as Ru is employed for the storage node. On the semiconductor substrate are provided an underlying interlayer insulation film located over both a capacitor region and a peripheral region, an interlayer insulation film located above the underlying interlayer insulation film, and a tubular metal film having a bottom end portion in contact with the underlying interlayer insulation film, and piercing the interlayer insulation film with the opening side located at the upper side in the capacitor region and the peripheral region. The opening side of the tubular metal film is formed only of a portion extending along the sidewall of a throughhole in the interlayer insulation film.

13 Claims, 31 Drawing Sheets

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

CAPACITOR REGION | MARK/TEG REGION (PERIPHERAL REGION)

DRAM CELL REGION | DRAM PERIPHERAL CIRCUIT REGION

DRAM CELL REGION | DRAM PERIPHERAL CIRCUIT REGION

DRAM CELL REGION | DRAM PERIPHERAL CIRCUIT REGION

DRAM CELL REGION | DRAM PERIPHERAL CIRCUIT REGION

DRAM CELL REGION | DRAM PERIPHERAL CIRCUIT REGION

DRAM CELL REGION | DRAM PERIPHERAL CIRCUIT REGION

DRAM CELL REGION    DRAM PERIPHERAL CIRCUIT REGION

DRAM CELL REGION | DRAM PERIPHERAL CIRCUIT REGION

DRAM CELL REGION | DRAM PERIPHERAL CIRCUIT REGION

DRAM CELL REGION    DRAM PERIPHERAL CIRCUIT REGION

DRAM CELL REGION   DRAM PERIPHERAL CIRCUIT REGION

DRAM CELL REGION | DRAM PERIPHERAL CIRCUIT REGION

DRAM CELL REGION | DRAM PERIPHERAL CIRCUIT REGION

DRAM CELL REGION    DRAM PERIPHERAL CIRCUIT REGION

DRAM CELL REGION | DRAM PERIPHERAL CIRCUIT REGION

CAPACITOR REGION | MARK/TEG REGION (PERIPHERAL REGION)

CAPACITOR REGION | MARK/TEG REGION (PERIPHERAL REGION)

SEMICONDUCTOR DEVICE

BACKGROUND OF THE INVENTION

1. Field of the Invention

The present invention relates to semiconductor devices, more particularly to a fine-geometry semiconductor device having a capacitor of high reliability.

2. Description of the Background Art

Referring to FIG. 36, an underlying interlayer insulation film 103 such as of a silicon oxide film is layered on a silicon substrate 101. An insulation film 105 such as of a silicon nitride film and/or a metal oxide film is disposed on underlying interlayer insulation film 103. An interlayer insulation film 107 such as of a silicon oxide film is deposited on insulation film 105. Insulation film 105 included in interlayer insulation film 107 can be conceived as a portion of interlayer insulation film 107.

This semiconductor device is mainly divided into a capacitor region where capacitors are provided and a mark and TEG (Test Element Group) region. The mark and TEG region including the peripheral circuit region in a DRAM (Dynamic Random Access Memory) is referred to as a peripheral region. A storage node 111 forming the lower electrode of the capacitor is provided within interlayer insulation film 107 in the capacitor region. In accordance with the microminiaturization of semiconductor devices, the thickness of the doped polycrystalline silicon forming the storage node has been reduced to achieve a larger capacitance of the capacitor. Reducing the thickness of this doped polycrystalline silicon film has induced the problem that a contact of the storage node is not feasible in the TEG region (refer to Japanese Patent Laying-Open No. 2001-339050, for example).

In addition to the above-described formation of a storage node using doped polycrystalline silicon, storage node 111 is formed of noble metal such as ruthenium (Ru) and platinum (Pt), or refractory metal such as tungsten (W). A plug interconnection 109 establishing electrical connection between storage node 111 and the silicon substrate is provided so as to pierce underlying interlayer insulation film 103. In the peripheral region of the layer identical to that of storage node 111, an alignment mark 113 required in photolithography, i.e., an overlay inspection mark or exposure system alignment mark, is formed. Alignment mark 113 is formed at the same step as storage node 111. Therefore, storage node 111 and alignment mark 113 are formed of the same material.

In the case where noble metal such as ruthenium or platinum is employed for storage node 111, the low adherence between storage node 111 and underlying insulation film 103 becomes problematic. In the subsequent annealing or oxidation process, particularly in the case where $Ta_2O_5$ is employed for the capacitor dielectric film, the storage node will easily peel off during the oxidation process (or crystalline process) of $Ta_2O$ by the ozone ($O_3$). Delamination of alignment mark 113 at the region extending on the surface of interlayer insulation film 107 in the peripheral region, such as portion "A" in FIG. 36 is particularly noticeable.

FIG. 37 shows a modification of the conventional semiconductor device of FIG. 36. Referring to FIG. 37, storage node 111 is of a cylindrical configuration with the tubular metal film protruding upwards. This cylindrical storage node is obtained by forming a hole in interlayer insulation film 107 of FIG. 36 and subjecting this hole to vapor deposition of a noble metal film such as Ru or Pt. The noble metal film is vapor-deposited to a predetermined thickness and then subjected to polishing by chemical mechanical polishing (CMP) or etching to have the portion other than that corresponding to the storage node removed. Then, interlayer insulation film 107 is removed by using a wetting solution such as HF. FIG. 37 is a sectional view of the semiconductor device after interlayer insulation film 107 has been removed.

In FIG. 37, storage node 111 and alignment mark 113 both have a cylindrical configuration. In the peripheral region, it is difficult to keep respective alignment marks in position as compared to the capacitor region. Configuration control could not be achieved. As a result, a cylindrical alignment mark formed at the same step as the storage node has the disadvantage of readily inducing mechanical fracture. A metal film with mechanical fracture will cause a short circuit in the semiconductor device by dispersion and reattachment during the processing steps. Thus, the reliability of the semiconductor device will be degraded.

SUMMARY OF THE INVENTION

An object of the present invention is to provide a semiconductor device having favorable adherence to the interlayer insulation film in both a capacitor region and a peripheral region even when the storage node is formed of a metal such as Ru, and absent of mechanical fracture that becomes the cause of a short circuit and the like.

Another object of the present invention is to provide a semiconductor device less likely to have a local step-graded portion generated between a peripheral region and a capacitor region in the case where a tubular conductor film in the peripheral region is of the concave type and a dielectric film covers the inner and outer face of the tubular conductor film in the capacitor region.

According to an aspect of the present invention, a semiconductor device is formed at a semiconductor substrate, and includes a capacitor region and a peripheral region. The semiconductor device includes an interlayer insulation film located above the semiconductor substrate, and a tubular metal film with a bottom end portion having the tubular bottom located at the lower side and an opening side located at the upper side so as to pierce the interlayer insulation film. The opening side of the tubular metal film is formed only of a portion that extends along the wall of a throughhole where that tubular metal film is located.

In the case where tantalum oxide ($Ta_2O_5$) or the like that has a high dielectric constant is employed for the dielectric film in order to ensure a predetermined capacitor in a semiconductor device such as a fine-geometry DRAM, oxidation treatment must be conducted subsequent to deposition of the dielectric film. Although the underlying electrode film may be oxidized at this stage, the capacitance of the capacitor can be ensured since the oxide such as ruthenium and platinum have conductivity. It is to be noted that ruthenium and platinum have poor adherence to the interlayer insulation film such as of silicon oxide. By removing the top extending portion on and in contact with the interlayer insulation film, the portion vulnerable to peel off can be removed to achieve high reliability. In the present specification, the lower side and the upper side based on a certain position refers to the side closer to the semiconductor substrate and the side opposite to the closer side, respectively. Also, "the portion extending along the wall of the throughhole" may include the portion extending above the interlayer insulation film as long as the portion extends along the wall of the throughhole. In other words, a top extending portion that extends on and in contact with the interlayer insulation film is to be eliminated. Such a top extending portion will extend along a plane crossing the wall of the throughhole.

In the present specification, the peripheral region includes a mark region, a TEG region, a peripheral circuit region, and the like. The capacitor region corresponds to the region of the semiconductor device where capacitors are formed, for example a memory cell region of a DRAM. The aforementioned tubular metal film constitutes the lower electrode of the capacitor in the capacitor region and constitutes an alignment mark or other marks in the mark region. In the TEG region, the tubular metal film can constitute the lower electrode of the capacitor or be employed for other objects.

According to another aspect of the present invention, a semiconductor device is formed on a semiconductor substrate, and includes a capacitor region and a peripheral region. The semiconductor device includes an interlayer insulation film located above the semiconductor substrate and over both the capacitor region and the peripheral region; a tubular impurity-containing semiconductor film with a bottom end portion, having the bottom located at the lower side and the opening side located at the upper side so as to pierce the interlayer insulation film in the capacitor region and the peripheral region; and a guard ring piercing through the interlayer insulation film, and extending so as to block the capacitor region from the peripheral region. There is a step-graded portion between the top of the guard ring and the top face of the interlayer insulation film in the peripheral region so that the top face of the interlayer insulation film in the peripheral region is located lower than the top of the guard ring.

In the case where the tubular conductor film is formed of a semiconductor film including impurities such as a polycrystalline silicon film, the adherence to the interlayer insulation film is favorable, contrary to a metal film. However, in the case where the tubular form is exposed in the peripheral region, the possibility of the tubular semiconductor film being fractured is high despite being a semiconductor film. Therefore, the tubular semiconductor film at the peripheral region is left having the outer circumference surrounded by the interlayer insulation film, i.e. takes a concave form, and the outer and inner planes of the tubular semiconductor film in the capacitor region are coated with the dielectric film to increase the capacitance.

In order to realize the above structure, (a1) generation of a local step-graded portion can be prevented by providing a guard ring, and (a2) permeation of an etching solution can be prevented by setting the top height of the interlayer insulation film in the peripheral region lower than the top of the guard ring, when the interlayer insulation film is left in the peripheral region and the interlayer insulation film in the capacitor region is removed. As a result, the subsequent planarization process can be facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
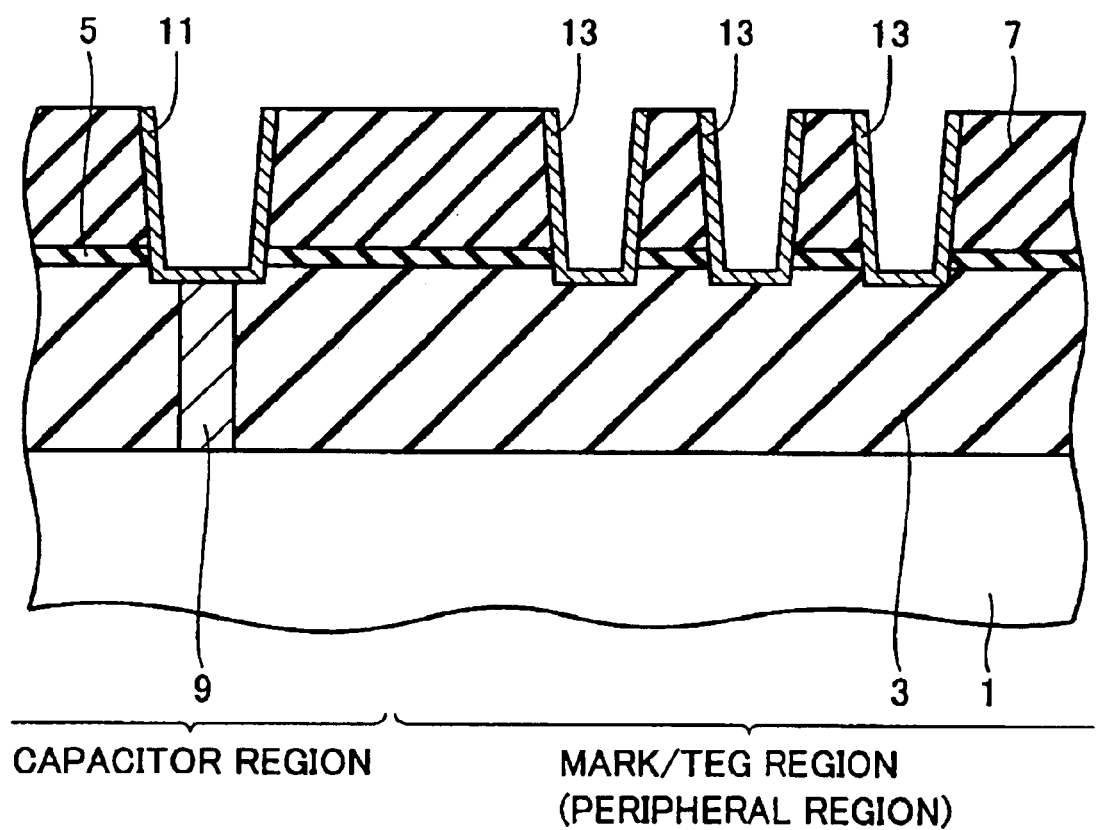
FIG. 1 is a schematic diagram of a semiconductor device according to a first embodiment of the present invention.

Referring to FIG. 1, an underlying interlayer insulation film 3 formed of a silicon oxide film or the like is disposed on a silicon substrate 1. An insulation film 5 such as of a silicon nitride film or metal oxide film is deposited on underlying interlayer insulation film 3. An interlayer insulation film 7 such as of a silicon oxide film is formed on insulation film 5. Tubular metal films 11 and 13 are formed in the capacitor region and the peripheral region (mark region and TEG region), respectively, so as to pierce interlayer insulation film 7 with the bottom of metal films 11 and 13 located at the lower side. As mentioned previously, the capacitor region includes the memory cell region of a DRAM and the like.

Tubular metal films 11 and 13 constitute the capacitor lower electrode, i.e., a storage node, in the capacitor region, and constitutes an alignment mark required in photolithography in the peripheral region. In the TEG region, the metal film constitutes the capacitor of the TEG region. Tubular metal films 11 and 13 are formed at the same step. The material thereof includes noble metal such as ruthenium (Ru) and platinum (Pt) deposited by CVD (Chemical Vapor Deposition), or refractory metal such as tungsten (W). The cross section of the tubular metal film is arbitrary, and may take a circular or polyangular configuration. However, a tubular metal film of a circular configuration is favorable from the standpoint of facilitating fabrication.

A conductive plug 9 piercing underlying interlayer insulation film 3 is formed, establishing conduction between a capacitor lower electrode 11 and an active region (not shown) of silicon substrate 1. Conductive plug 9 is formed of a refectory metal nitride film such as TiN or TaN.

A method of fabricating the characterizing portion of the semiconductor device of FIG. 1 will be described here. More specifically, a method of fabricating a semiconductor device wherein the tubular metal film does not have a portion extending at the top face of the interlayer insulation film will be described. By etching interlayer insulation film 7 and insulation film 5, a hole pattern for the vapor-deposition of a tubular metal film is formed (refer to FIG. 2). When this hole pattern and a trench pattern of the guard ring that will be described afterwards are to be designated together, the term "hole trench pattern" will be used.

Figure 2:
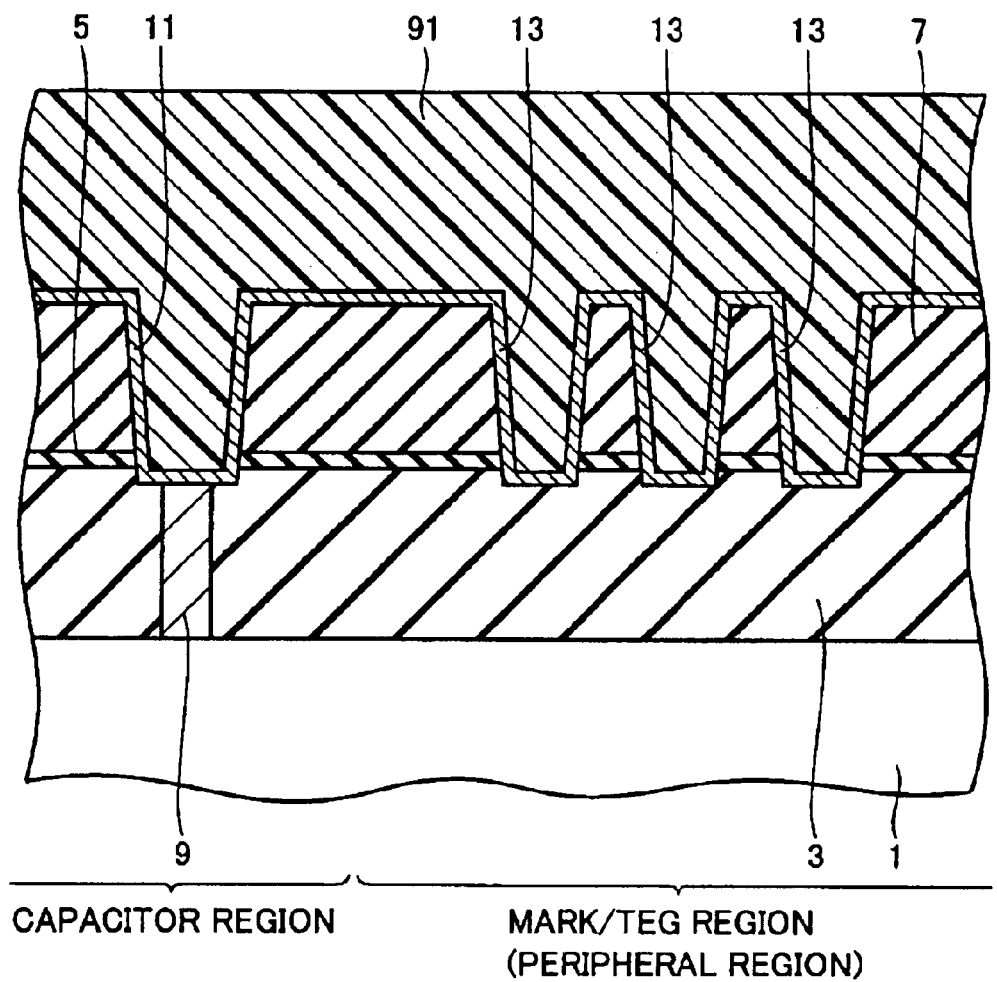
FIG. 2 shows the semiconductor device of FIG. 1 in a state where the substrate is entirely coated with a photoresist after vapor-deposition of a metal film, preceding the state of FIG. 1.

Then, metal films 11 and 13 covering the entire surface of the substrate, i.e. covering the interior of the hole pattern and the top face of interlayer insulation film 7 are deposited by evaporation. Then, a resist 91 or a silicon oxide film type application film is applied (FIG. 2). Then, CMP (Chemical Mechanical Polishing) is applied until interlayer insulation film 7 is exposed, resulting in the state shown in FIG. 3.

Although not shown, a dielectric film is provided on tubular metal films 11 and 13 to form a capacitor. In the present embodiment, tantalum oxide ($Ta_2O_5$) having a high dielectric constant is employed for the dielectric film. In the case where $Ta_2O_5$ is deposited, an oxidation process by ozone or crystalline process must be carried out. When noble metal such as Ru and Pt or refractory metal such as W is employed for capacitor lower electrode 11, the capacitance of capacitor will not be reduced even if oxidized through the ozone processing or the like since the oxide of such metal has conductivity and will function as an electrode.

Figure 36:
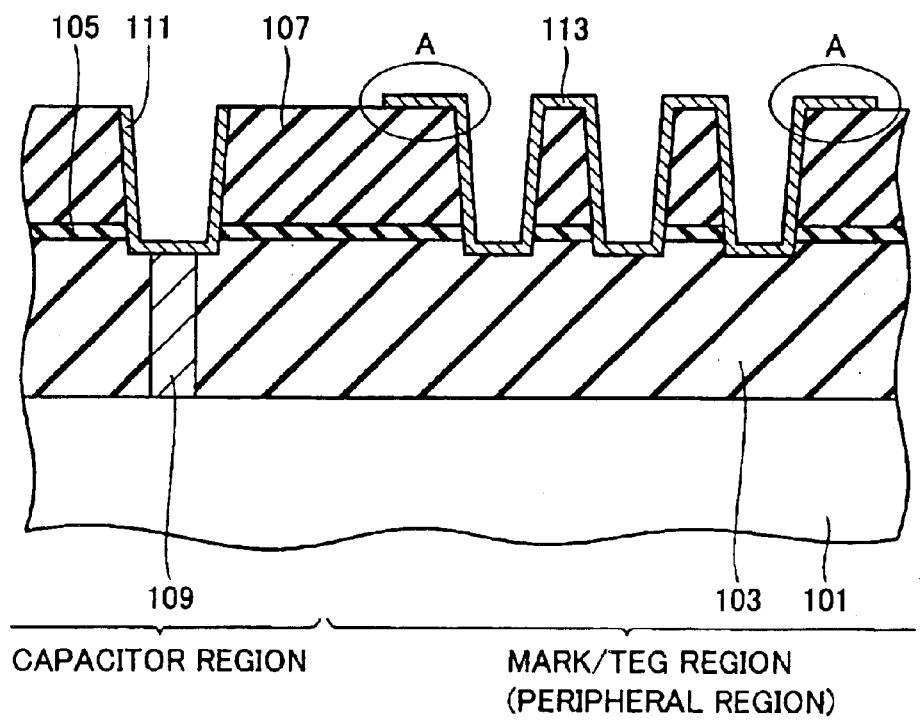
FIG. 36 shows a conventional semiconductor device.

In the case where the aforementioned noble metal and refractory metal are employed, any portion extending on interlayer insulation film 7 as portion "A" shown in FIG. 36 will be easily delaminated. In the present invention, the surface of the interlayer insulation film absent of a portion extending on interlayer insulation film 7 is in flush with the leading end of electrode 13 corresponding to a mark, as shown in FIG. 1. It is to be noted that the aforementioned extending portion is not left on the TEG region. By virtue of the arrangement of the tubular metal film, the disadvantage of peel off and the like will not occur.

Figure 3:
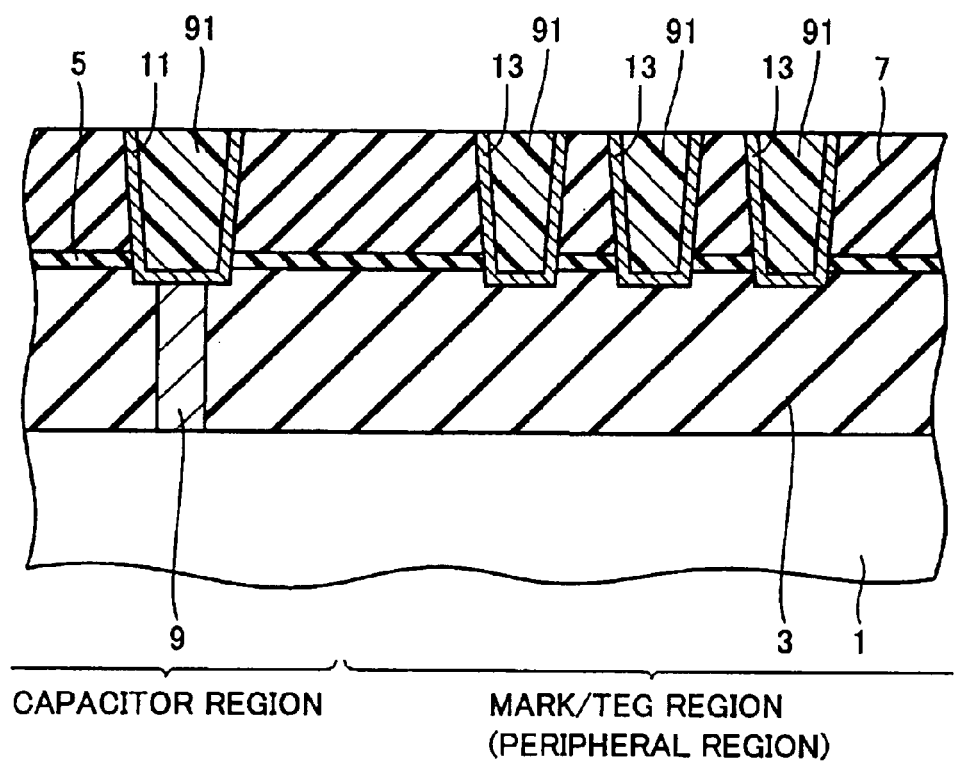
FIG. 3 shows the semiconductor device of the first embodiment subjected to polishing by CMP from the state of FIG. 2.

FIGS. 1–3 are schematic views of the semiconductor device of the first embodiment, focusing on the portion of the capacitor lower electrode. The remaining elements of the semiconductor device corresponding to an MOS transistor, for example, the source/drain region, the gate electrode, and the like are not depicted. The same applies to the description hereinafter.

The fabrication method of the semiconductor device of the present invention includes, from the widest aspect, the steps set forth hereinafter. The semiconductor device is formed on a semiconductor substrate, and includes a capacitor region and a peripheral region. The fabrication method includes the steps of forming an interlayer insulation film upward of the semiconductor substrate, forming a hole pattern at both the capacitor region and the peripheral region and also forming a trench pattern at the boundary between the capacitor region and the peripheral region so as to pierce the interlayer insulation film, and applying a conductive film so as to cover the inner plane of the hole pattern and the trench pattern as well as the interlayer insulation film. The fabrication method further includes the steps of removing a portion corresponding to a predetermined thickness from the top face of the interlayer insulation film together with the conductive film applied on the interlayer insulation film, forming a photoresist pattern so as to cover the peripheral region and not cover the capacitor region, removing the interlayer insulation film from the capacitor region using a photoresist pattern as a mask.

The above conductive film may be a metal film or a semiconductor film including impurities. According to the above-described method, high capacitance can be ensured at the capacitor region, and the conductive film in the peripheral region has its circumference supported by the interlayer insulation film. Therefore, mechanical fracture can be prevented. Also, formation of a guard ring allows generation of a local step-graded portion to be suppressed, resulting in facilitating the planarization process carried out at a subsequent step.

Second Embodiment

Figure 37:
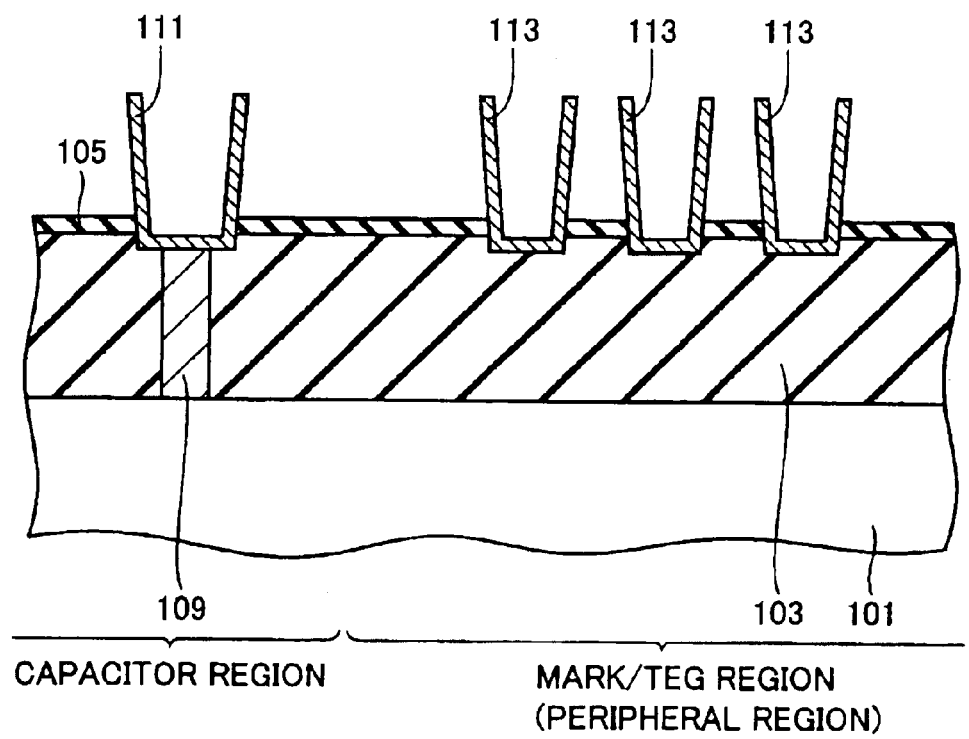
FIG. 37 is a diagram to describe a fabrication method of a conventional semiconductor device.

It is of common practice to form a capacitor lower electrode in a cylindrical configuration in the capacitor region. However, the protrusion of a tubular metal film in the peripheral region may induce fracture of the metal film as described with reference to FIG. 37 during the fabrication process of the semiconductor device, resulting in occurrence of a short circuit. The present embodiment is directed to a fabrication method eliminating such a disadvantage occurring when a cylindrical capacitor lower electrode is provided.

Figure 4:
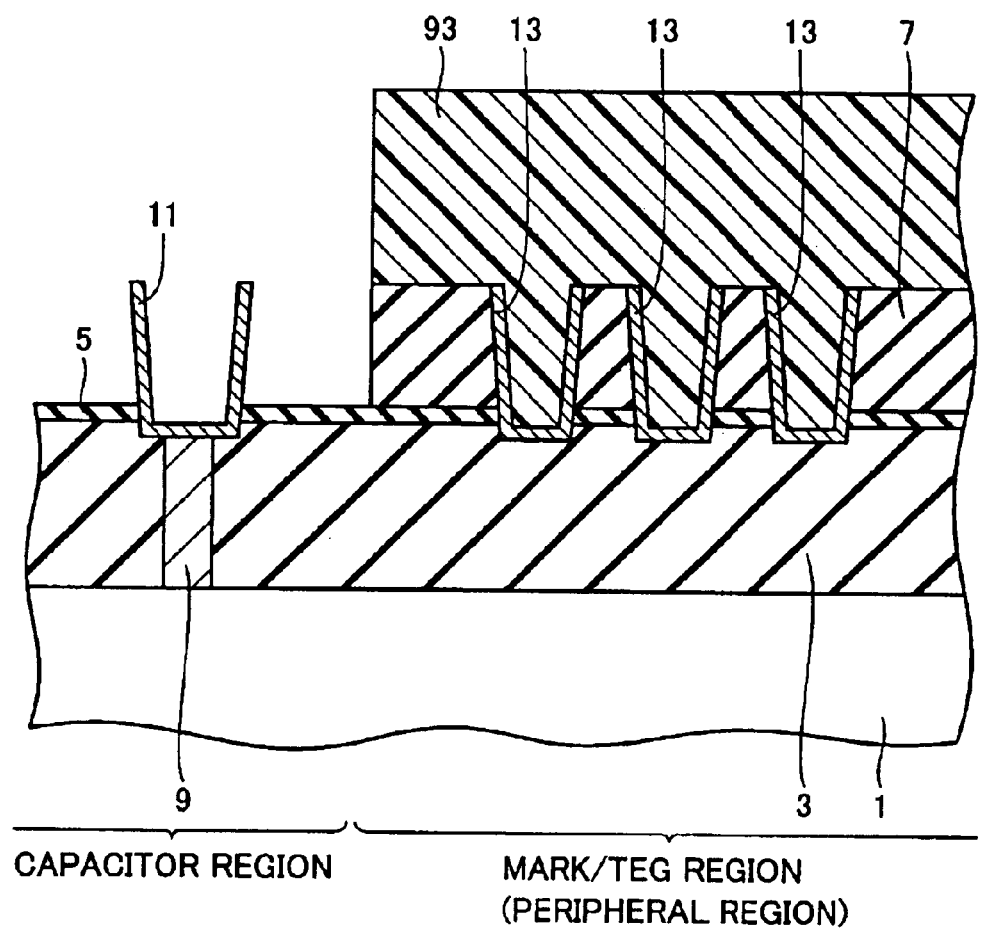
FIG. 4 shows a fabrication method of a semiconductor device according to a second embodiment of the present invention.

FIG. 4 corresponds to the state where a resist pattern 93 is disposed only on the substrate in the peripheral region with respect to the state of, for example, FIG. 3, having the interlayer insulation film removed from a desired region in the capacitor region. In the state of FIG. 4, the cylindrical configuration in the peripheral region is not exposed and will not project upwards. Specifically, a concave tubular metal film is obtained. Selective removal of the interlayer insulation film in the capacitor region is to be effected using a wetting solution such as HF.

According to the above method, exposure of the alignment mark or the like in the peripheral region to protrude upwards can be avoided. Thus, the inner plane and outer plane of the exposed cylindrical configuration is covered by a dielectric film in the capacitor region to ensure the capacitance of the capacitor while preventing the conventional problem of short circuiting caused by fracture of the tubular metal film in the peripheral region. The configuration of the capacitor lower electrode is not limited to a circular cylinder, and may be a rectangular column or the like as long as it is tubular.

Third Embodiment

Figure 5:
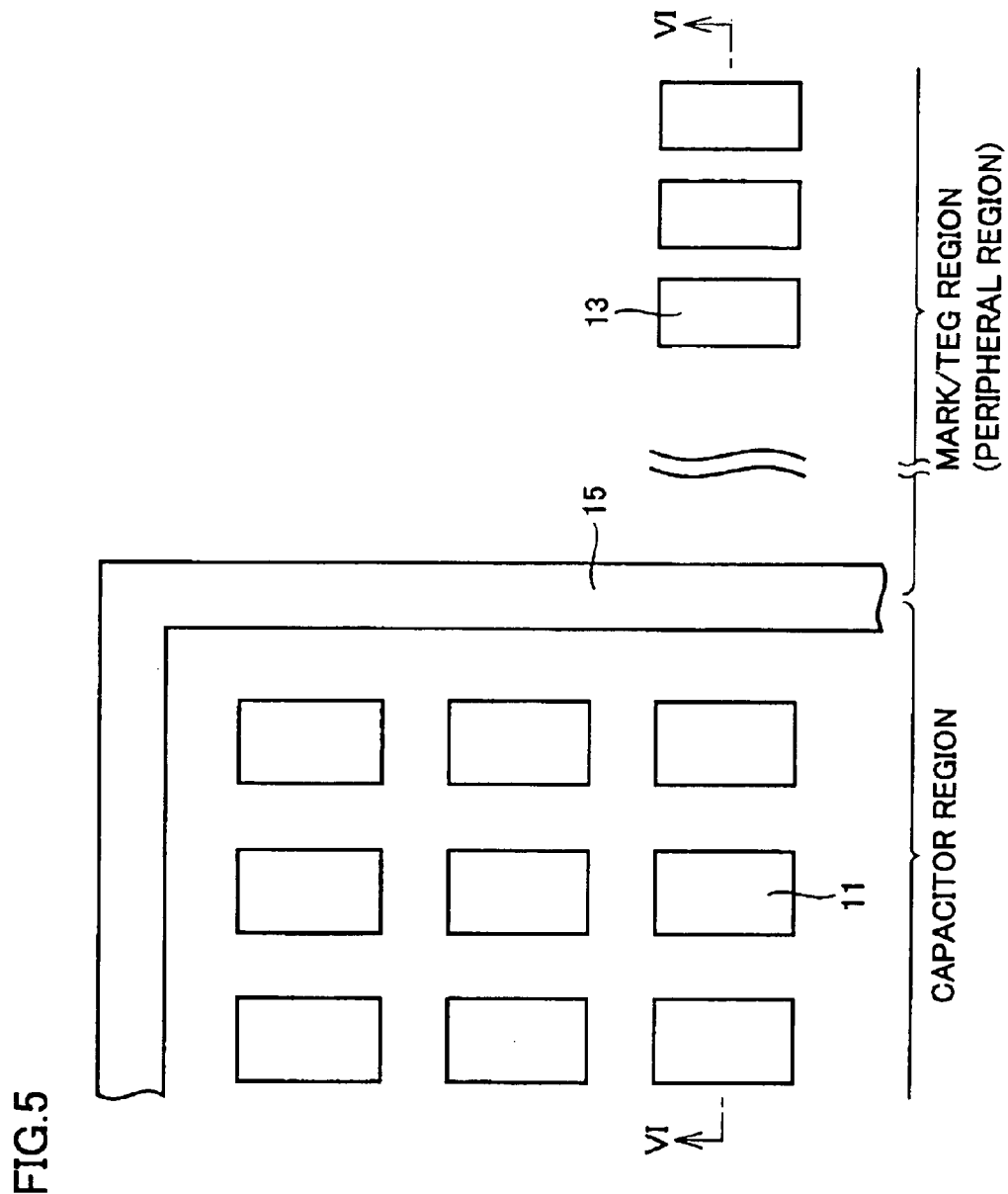
FIG. 5 is a schematic plan view of a semiconductor device according to a third embodiment of the present invention.
Figure 6:
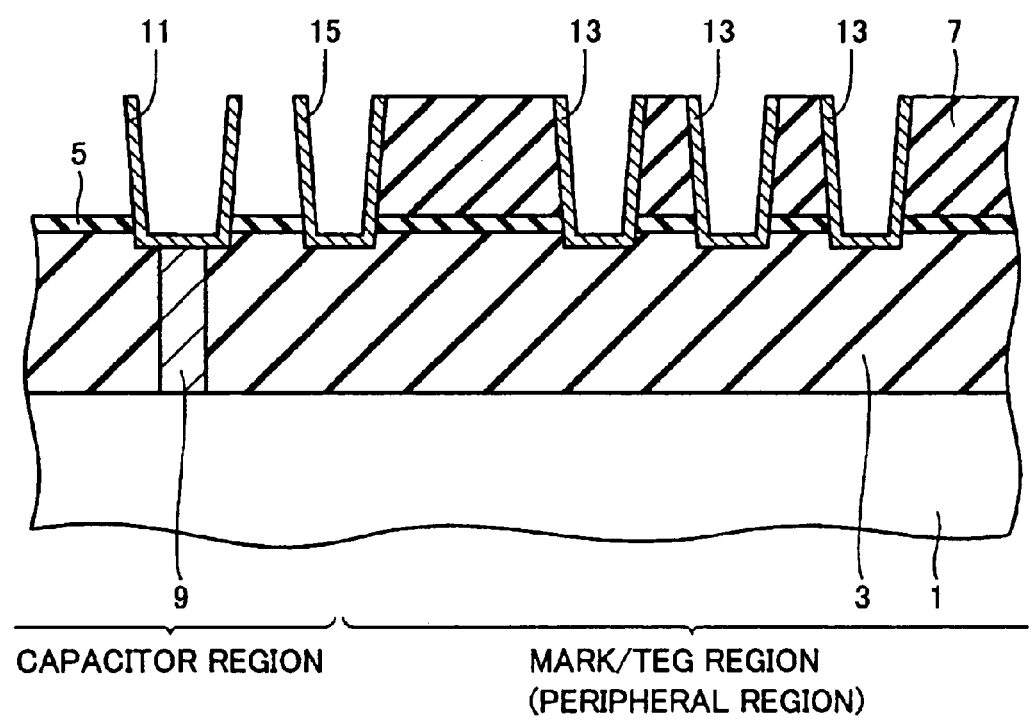
FIG. 6 is a sectional view of the semiconductor device of FIG. 5 taken along line VI—VI.

The third embodiment is characterized in that, when the interlayer insulation film is left in the peripheral region and the interlayer insulation film in the capacitor region is to be selectively removed, the wall of the interlayer insulation film is not exposed at the boundary between the peripheral region and the capacitor region. FIG. 5 is a plan view of a semiconductor device of the present embodiment whereas FIG. 6 is a sectional view taken along line VI—VI of FIG. 5. Referring to FIG. 5, there is provided a guard ring 15 piercing through the interlayer insulation film and extending along the boundary between the capacitor region and the peripheral region to cut across the regions.

Figure 7:
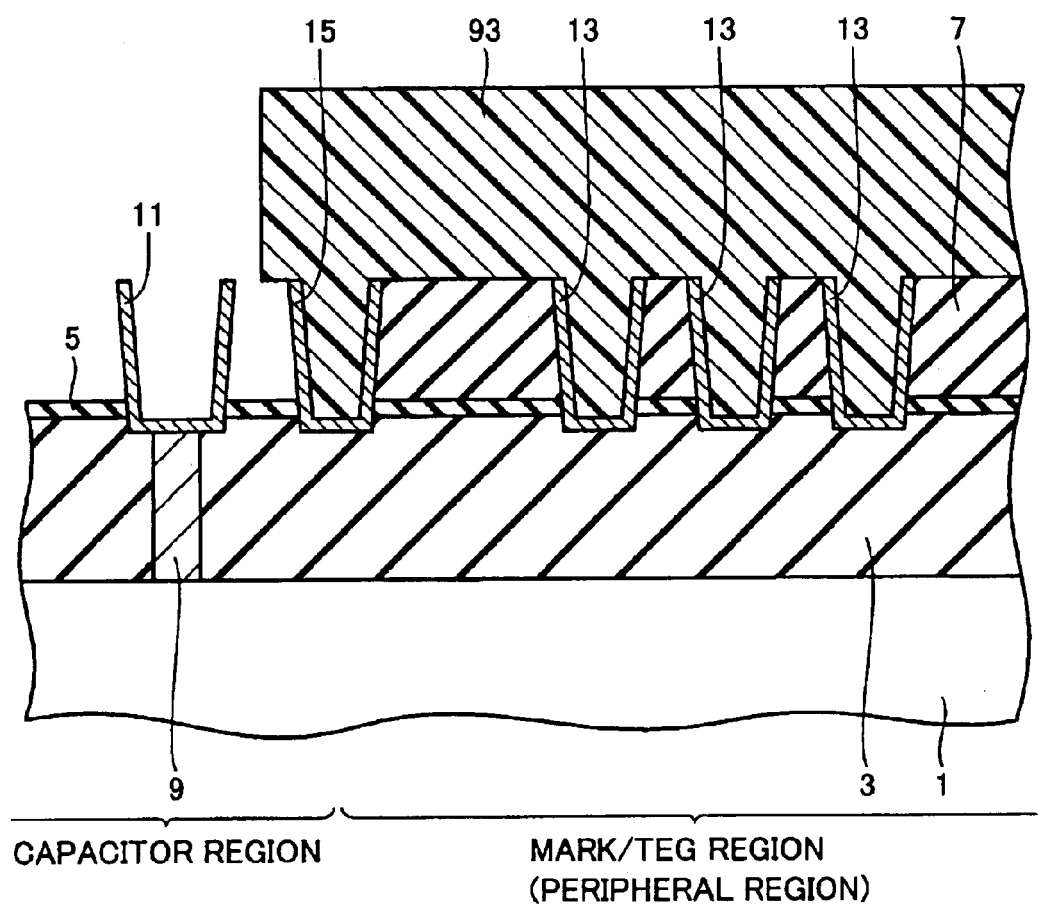
FIG. 7 shows a semiconductor device, prior to the state of FIG. 6.

Guard ring 15 is formed as set below. Following the deposition of interlayer insulation film 7, a guard ring trench pattern is formed along the boundary between the capacitor region and the peripheral region during the formation of a capacitor lower electrode or a hole pattern corresponding to an alignment mark in the peripheral region using a resist pattern or the like as a mask. Then, a tubular metal film that is to be the capacitor lower electrode is vapor-deposited all over the substrate. At this stage, the metal film is also applied in the guard ring trench pattern. By effecting polishing by CMP as in the steps of FIGS. 2 and 3, a guard ring is obtained. By the arrangement of guard ring 15, the interior of the guard ring, the peripheral circuit region, and also the mark region and TEG region are covered with a photoresist, as shown in FIG. 7. Then, only the interlayer insulation film in the capacitor region is removed using a solution of HF and the like. During the selective etching of the interlayer insulation film in the capacitor region, the wall of interlayer insulation film 7 remaining in the peripheral region will not be exposed towards the capacitor region, as shown in FIG. 7. Therefore, the local step-graded portion of the interlayer insulation film is eliminated.

A local step-graded portion in the interlayer insulation film is disadvantageous in that planarization cannot be ensured in the subsequent planarization process, resulting in degradation in the processing of wiring. By covering the wall of the interlayer insulation film with guard ring 15 in the above etching process, there will be no step-graded portion. The subsequent planarization process can be facilitated to improve the wiring processing.

Fourth Embodiment

Figure 8:
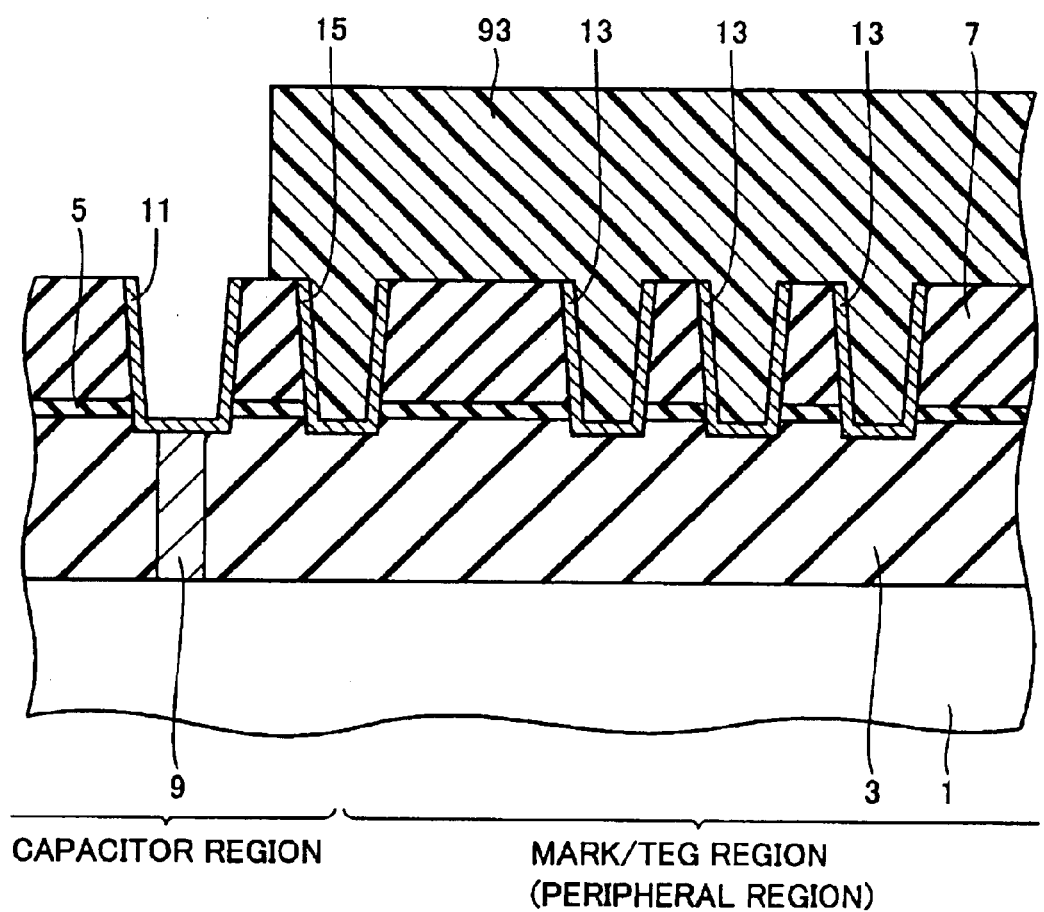
FIG. 8 is a sectional view of a semiconductor device according to a fourth embodiment of the present invention corresponding to the state where a resist pattern covering the guard ring from the peripheral region is formed.
Figure 9:
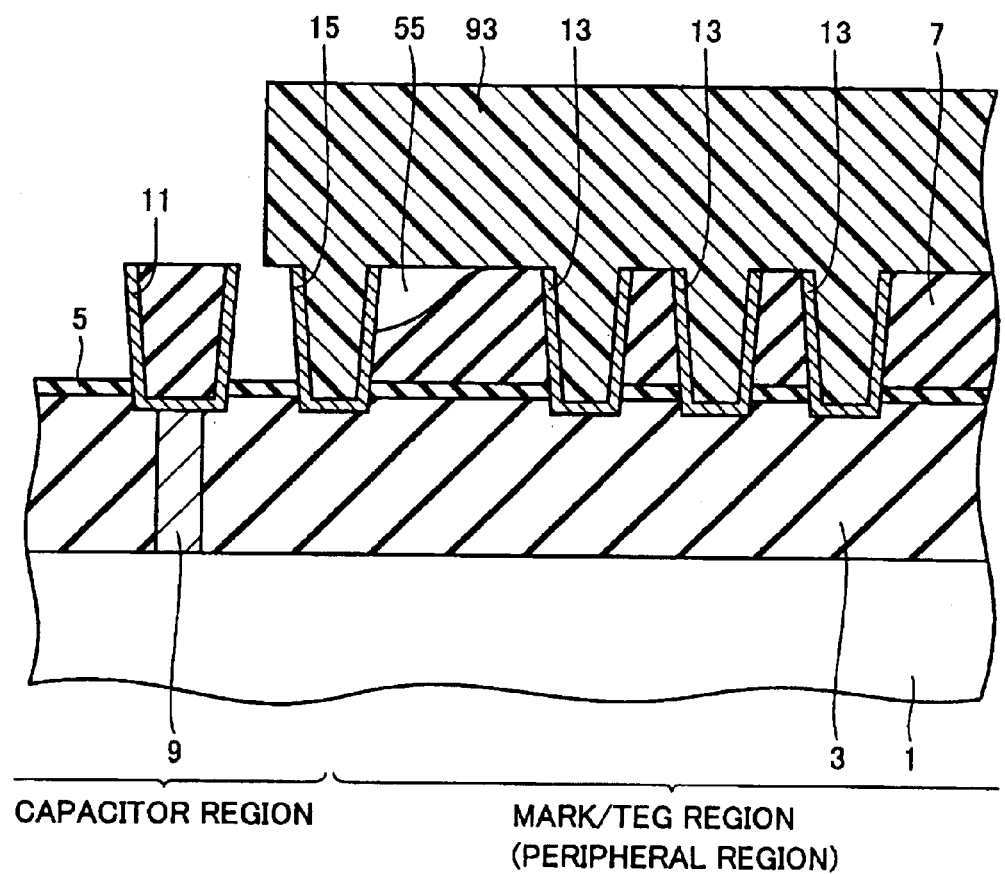
FIG. 9 shows a semiconductor device from the state of FIG. 8, corresponding to the state where the etchant used to remove the interlayer insulation film in the capacitor region permeates into the peripheral region.

In the previous third embodiment, a resist pattern 93 as shown in FIG. 8, for example, is provided, and the interlayer insulation film in the capacitor region is etched away with a wetting solution such as HF. In this case, the only contact between resist pattern 93 and the guard ring is established at the top of the guard ring. Therefore, the wetting solution may penetrate into the interlayer insulation film in the peripheral region, whereby a portion 55 will be etched at the interlayer insulation film in the peripheral region, as shown in FIG. 9. This penetration will cause a local step-graded portion to be generated in the outer perimeter region of the guard ring at the peripheral circuit side. The subsequent planarization process will not be feasible, inducing the possibility of wiring shorting. By a surface treatment prior to application of the photoresist, using an acid solution such as sulfuric acid or an alkaline solution such as ammonia liquid, the surface of the interlayer insulation film can be modified to suppress penetration.

The fourth embodiment of the present invention is characterized in that a structure to increase the margin to suppress penetration is employed, without depending upon the above-described modification of the interlayer insulation film.

Figure 10:
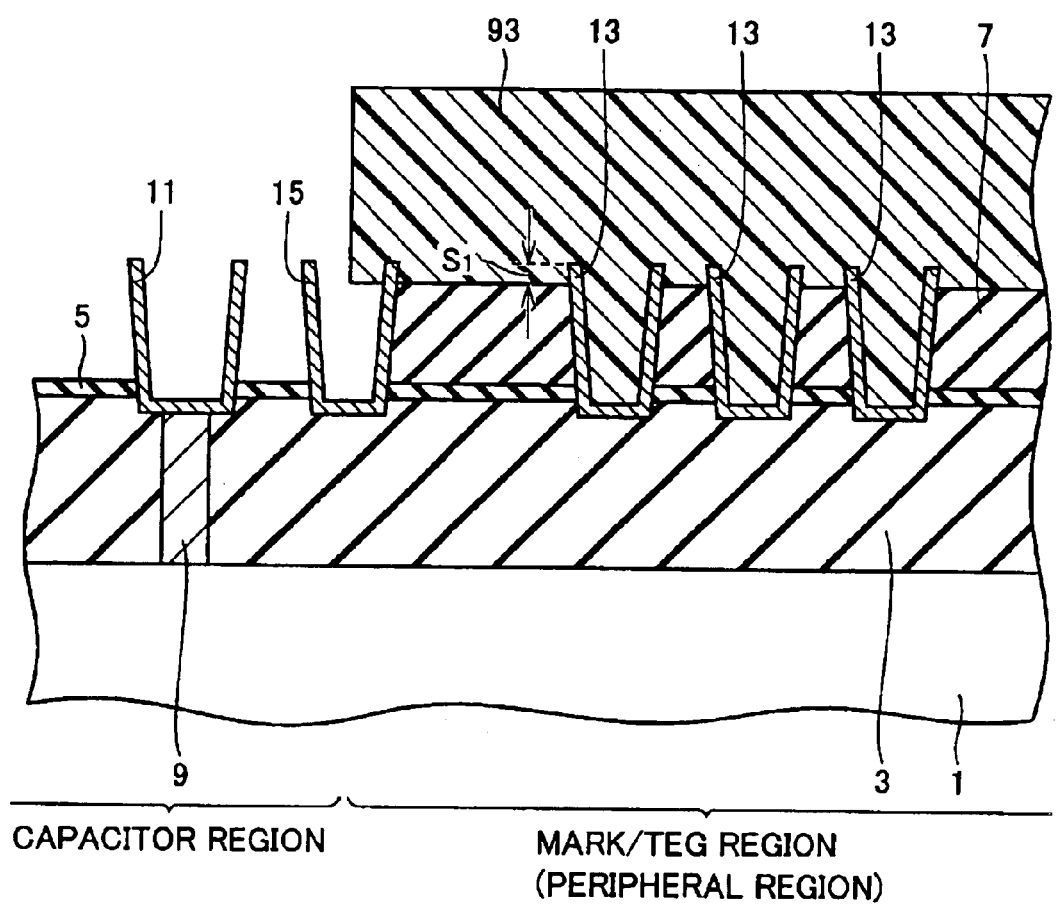
FIG. 10 is a sectional view of a semiconductor device corresponding to the state where the top face of the interlayer insulation film is set lower than the leading edge of the tubular metal film by etching back the entire surface, a resist pattern is formed covering the peripheral region, and the interlayer insulation film is removed from the capacitor region.
Figure 11:
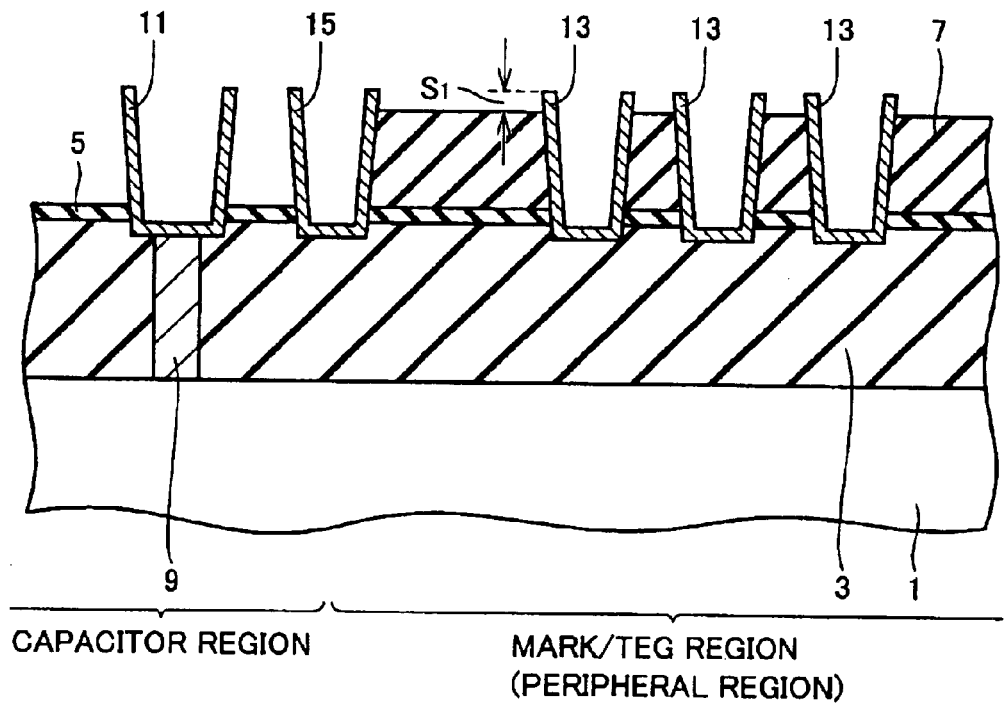
FIG. 11 is a sectional view of a semiconductor device having the resist pattern removed from the state of FIG. 10.

Referring to FIG. 3, prior to application of a photoresist, the entire surface is etched back using an HF solution and without a mask. By this etch back process on the entire surface, the interlayer insulation film becomes thinner by S1 from the top of the tubular metal film. The dimension of the concave from the top of the tubular metal film is preferably 50–100 nm. Then, a resist pattern is formed, and the interlayer insulation film in the capacitor region is removed by an etchant, as shown in FIG. 10. By this concave S from the top of the tubular metal film and guard ring, the contacting area of the tubular metal film and guard ring with respect to the photoresist is increased to suppress penetration of the wetting solution from the capacitor region side. FIG. 11 corresponds to the state where the resist pattern is removed after the selective removal step of the interlayer insulation film from the capacitor region. Since there is no local step-graded portion, planarization at a subsequent process can be facilitated.

Fifth Embodiment

Figure 12:
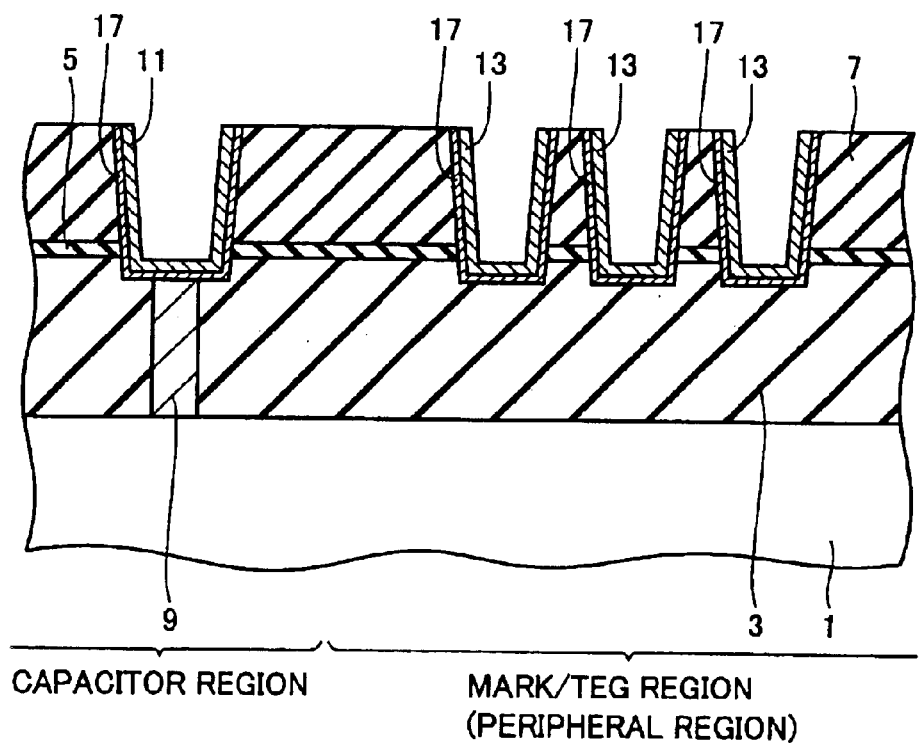
FIG. 12 is a schematic diagram of a semiconductor device according to a fifth embodiment of the present invention.
Figure 13:
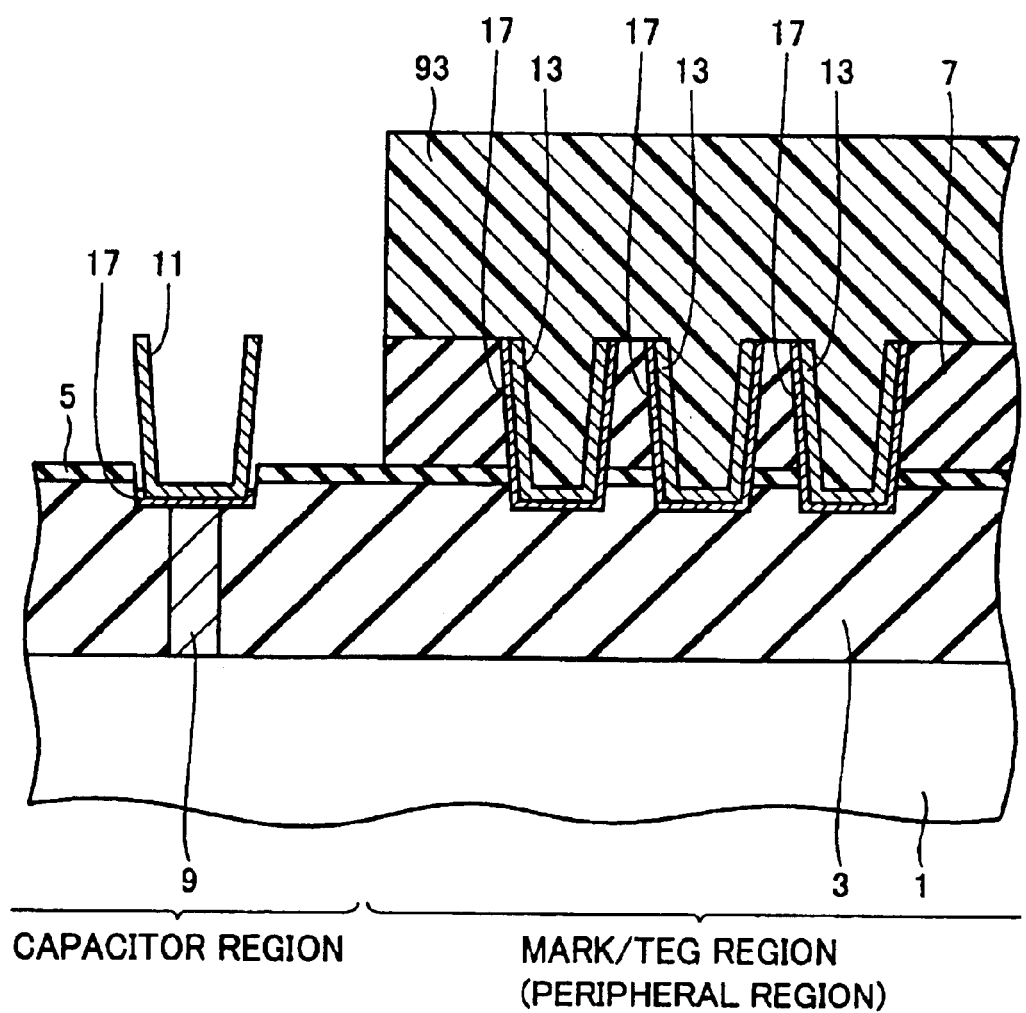
FIG. 13 is a sectional view of a semiconductor device corresponding to the state where a resist pattern covering the peripheral region is formed, and the interlayer insulation film is removed from the capacitor region.
Figure 14:
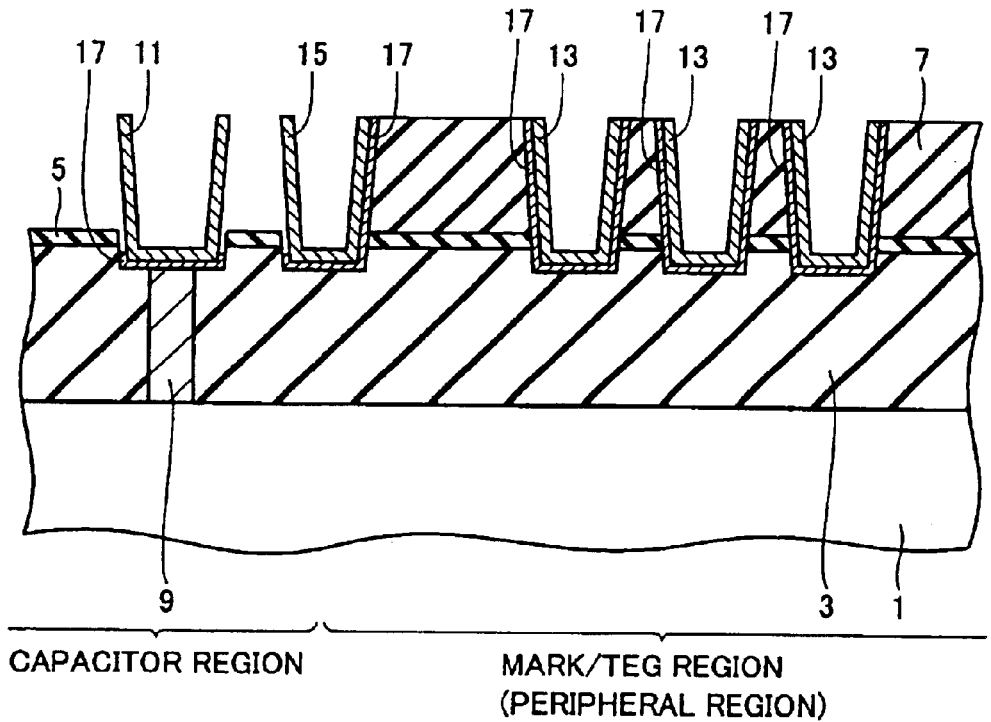
FIG. 14 is a sectional view of the semiconductor device of the fifth embodiment, corresponding to the state where a guard ring is provided and the interlayer insulation film is removed from the capacitor region.

FIGS. 12–14 are schematic views of a semiconductor device according to a fifth embodiment of the present invention. The fifth embodiment is characterized in that an adhesion layer 17 is provided between tubular metal films 11, 13 in the mark region or TEG region and interlayer insulation film 7, as shown in FIGS. 12–14. Adhesion layer 17 is formed of a refractory metal nitride film such as TiN, TaN, and the like. FIG. 13 shows a fabrication method in which the capacitor lower electrode in the capacitor region takes a cylindrical configuration and the tubular metal film in the mark region and the TEG region takes a concave configuration. At the capacitor lower electrode, underlying metal film 17 formed of a refractory metal nitride film remains only at the bottom of the capacitor lower electrode. The adherence of the capacitor lower electrode is improved through this refractory metal nitride film at the bottom.

FIG. 14 corresponds to the case where guard ring 15 is formed so that a local step-graded portion will not be generated at the edge of the interlayer insulation film left in the peripheral region during the etching process when a concave type tubular metal film is to be formed in the peripheral region. Although the underlying metal film with respect to guard ring 15 remains at the side in contact with the interlayer insulation film as well as at the bottom, the underlying metal film at the capacitor region side is removed. The underlying metal film at the bottom can function sufficiently to improve the adherence to the interlayer insulation film.

By providing an adhesion layer 17 with respect to the tubular metal film formed of a double-layered tubular metal film, the adherence between the tubular metal film and the interlayer insulation film can be improved. Even if the metal film in the TEG region or mark region is provided in a cylindrical configuration, adherence is improved at the bottom region. Therefore, mechanical fracture is eliminated to a device of higher reliability.

Figure 15:
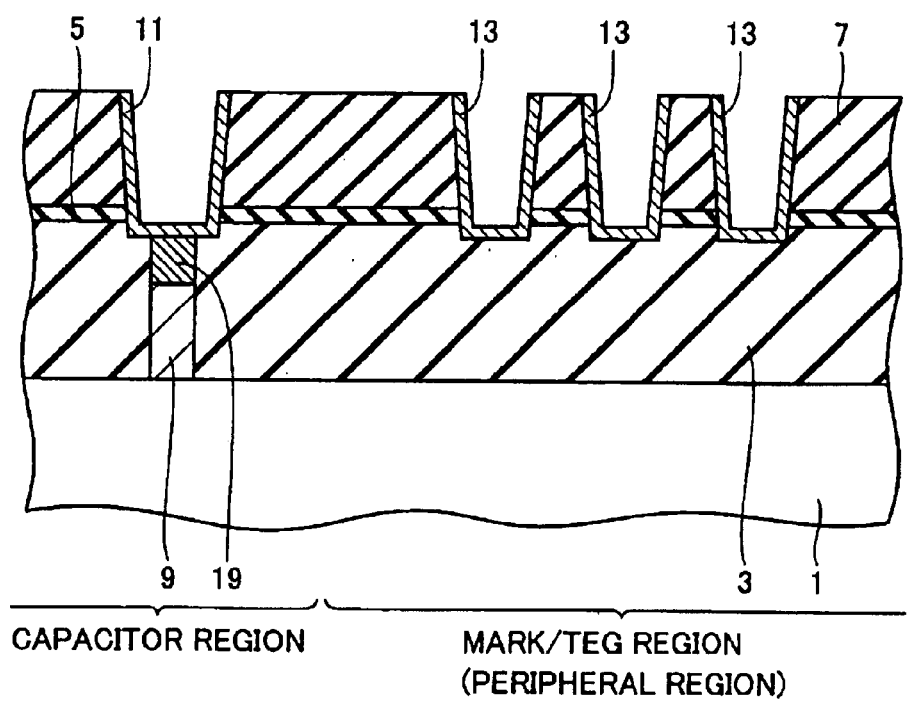
FIG. 15 shows a modification of the semiconductor device of the fifth embodiment, having the upper portion of the conductive plug formed of a material of high adherence.
Figure 16:
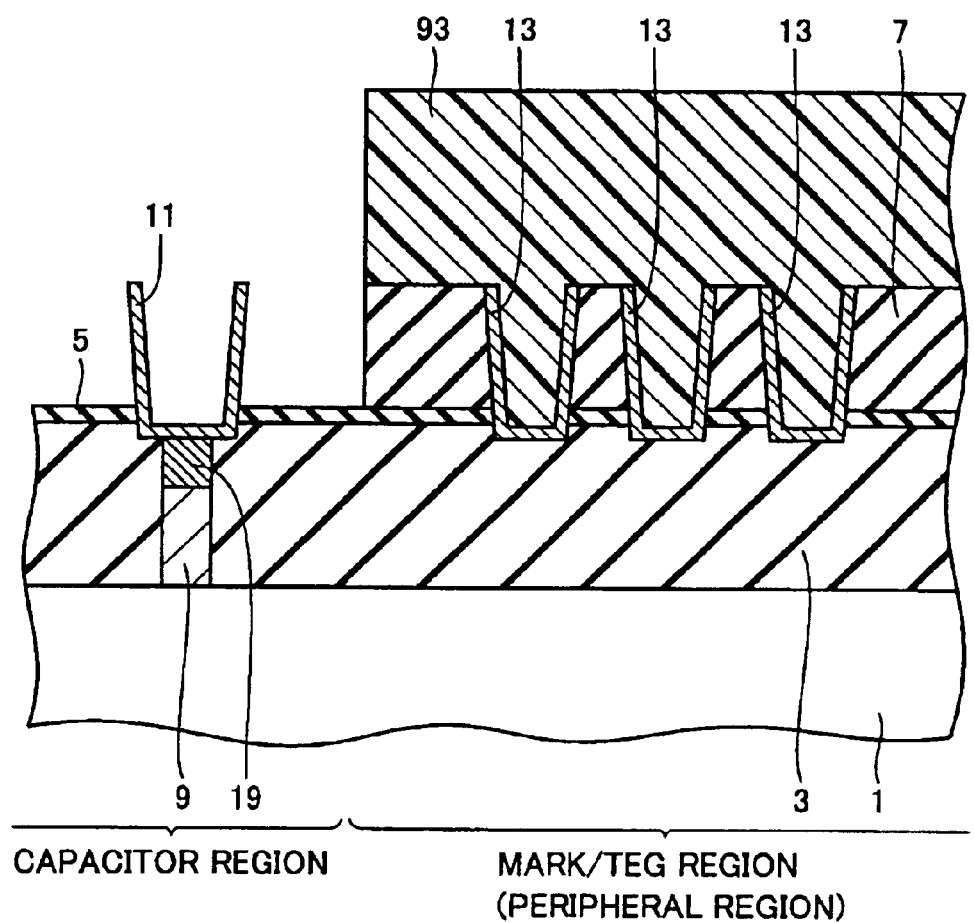
FIG. 16 shows a modification of the semiconductor device of the fifth embodiment, having the upper portion of the conductive plug formed of a material of high adherence, corresponding to the state where the interlayer insulation film is removed from the capacitor region.
Figure 17:
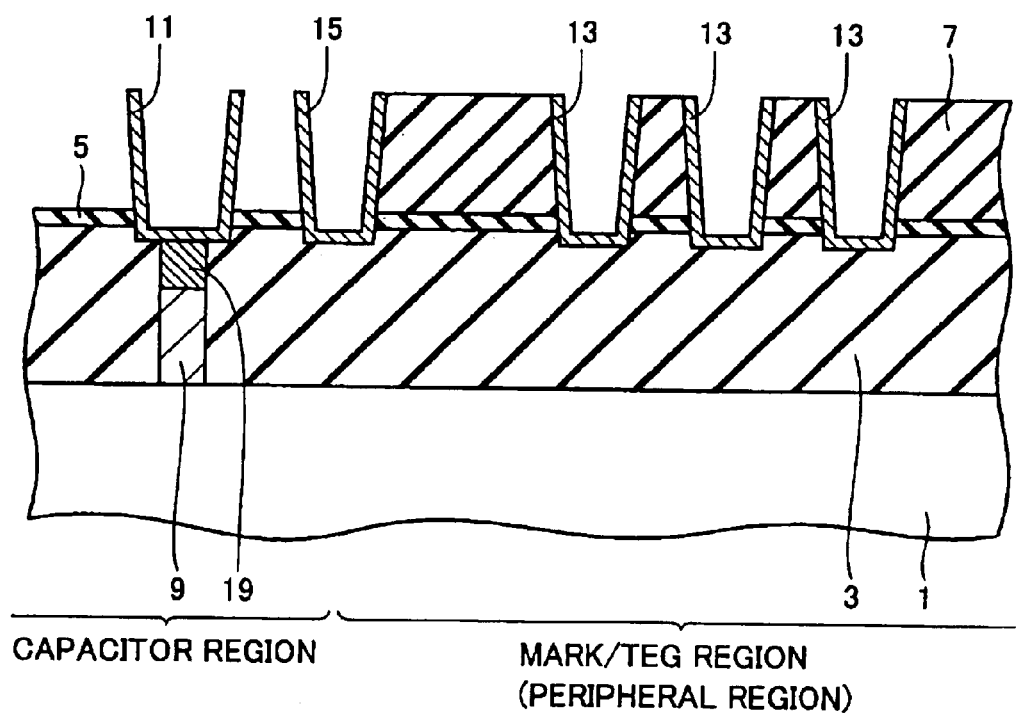
FIG. 17 shows a modification of the fifth embodiment having the upper portion of the conductive plug formed of a material of high adherence, corresponding to the state where a guard ring is provided and the interlayer insulation film is removed from the capacitor region.

FIGS. 15, 16 and 17 are modifications of the fifth embodiment, corresponding to FIGS. 12, 13 and 14, respectively. Referring to FIG. 15, conductive plugs 9 and 19 are formed of two layers. A refractory metal nitride film such as TiN and TaN having favorable adherence to the tubular metal film is to be used for upper connection 19 establishing contact with capacitor lower electrode 11. For lower connection 9, polycrystalline silicon including impurities is to be used.

FIG. 16 shows a semiconductor device corresponding to the case where a capacitor lower electrode takes a cylindrical configuration, and the tubular metal film in the peripheral region takes a concave configuration. The adherence to the capacitor lower electrode can be improved by employing TiN or the like for upper connection 19 of the conductive plug. FIG. 17 corresponds to the case where a guard ring 15 to prevent penetration of the wetting solution during the etching process is arranged in the case where tubular metal film 13 in the peripheral region takes a concave configuration. By employing a refractory nitride such as TiN having favorable adherence for upper portion 19 of the conductive plug, the adherence to the capacitor lower electrode can be improved at the bottom region.

Sixth Embodiment

Figure 18:
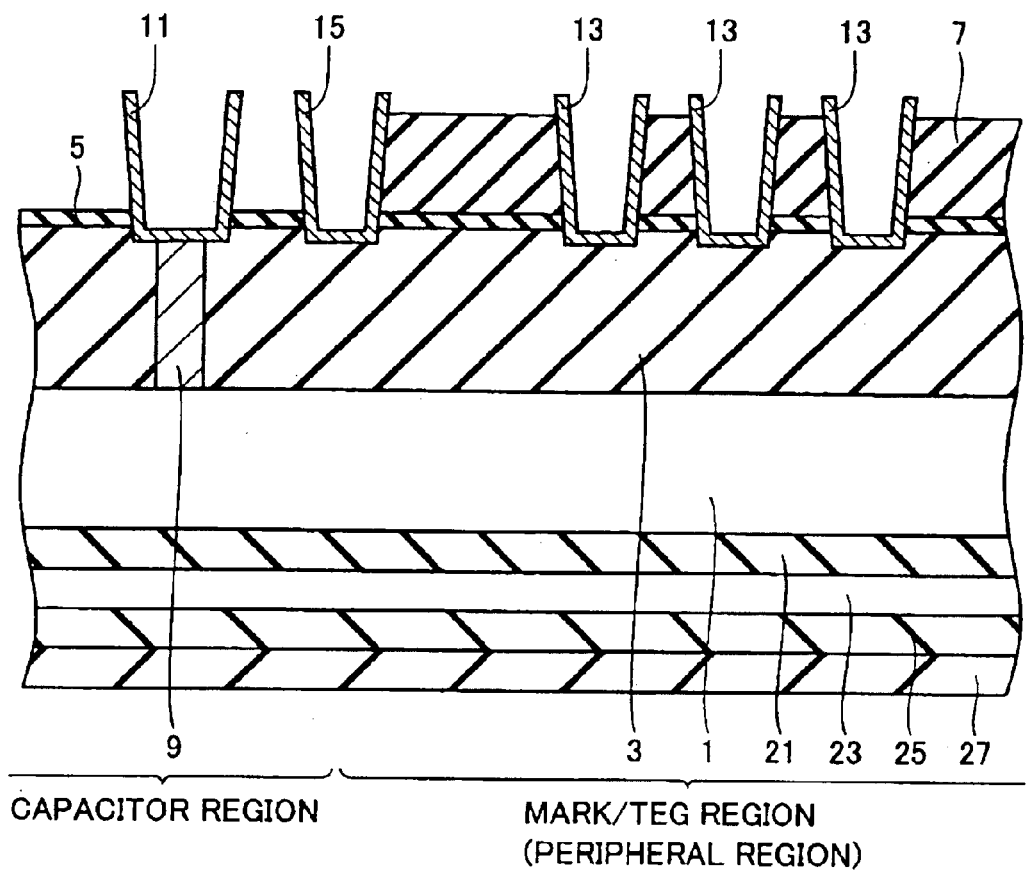
FIG. 18 is a sectional view of a semiconductor device according to a sixth embodiment of the present invention, corresponding to a state where the metal film at the backside of the silicon substrate is removed according to a fabrication method thereof.

FIG. 18 is a diagram to describe a fabrication method of a semiconductor device according to a sixth embodiment of the present invention. In the case where evaporation is effected by CVD when a metal film such as ruthenium or platinum is employed for the capacitor lower electrode as described above, the spread towards the backside of the wafer occurs. In this case, there is a possibility of the metal film peeling off from the insulation film at the backside during the subsequent annealing or oxidation process since the metal film forms plane-contact with backside insulation films 21, 25 and 27 located at the backside of the wafer, as shown in FIG. 18. It is to be noted that a polycrystalline silicon film 23 is formed among the backside insulation films.

In the sixth embodiment, the metal film spread around the backside is removed with an etching solution of nitric acid immediately after a ruthenium electrode is vapor-deposited by CVD, for example, during the in-process. This removal of the metal film prevents peel off of the metal film at the backside and allows improvement of the yield and device reliability. Specifically, the layered film at the backside is formed by the stacks of, for example, a silicon oxide film 21, a polysilicon film 23, a silicon nitride film 25 and a silicon oxide film 27. Since an etching solution to remove the metal film adhering at the backside is to be used, a metal film identical to that of the capacitor lower electrode should not be included in the multilayer film at the backside. This is because such a metal film will be etched to cause delamination of the multilayer film.

Seventh Embodiment

The seventh embodiment is directed to the application of the structure described in the fourth embodiment to a DRAM.

The present embodiment will be described with reference to FIG. 34. Well implantation regions 2 and 4 are provided at the silicon substrate. A shallow trench isolation 6 is formed in a predetermined region at the surface of well implantation regions 2 and 4. An implantation layer 26 of low concentration is formed at the surface layer of one of the well implantation regions. An implantation layer 28 of high concentration is formed at the surface layer of the other of the well implantation regions. A gate oxide film 8 is formed so as to cover the surface of the silicon substrate. On gate oxide film 8 are arranged a polycrystalline silicon film 12 including impurities, a barrier metal 14 formed of a refractory metal nitride film such as TiN, WN and TaN, a refractory metal film 16 such as of tungsten, an insulation film 18 such as of a silicon nitride film, and a sidewall 22 covering the side faces of the layered film to form a gate electrode. An insulation film 22 is deposited so as to cover the silicon substrate where the gate electrode is formed.

An interlayer insulation film 32 is deposited on insulation film 22. In interlayer insulation film 32, a conductive plug 34 is formed, conducting between the active layer at the surface of the silicon substrate and the upper portion. Another interlayer insulation film 36 is deposited on interlayer insulation film 32. A conductive plug is provided so as to pierce interlayer insulation film 36 and the underlying interlayer insulation film 32 to establish conduction with the active region of the silicon substrate. The conductive plug is formed of an underlying barrier metal 38 and a metal film 40 such as of W, Cu, or the like.

An interlayer insulation film 42 is formed on interlayer insulation film 36. Another interlayer insulation film 46 is deposited on interlayer insulation film 42. Interlayer insulation film 42 corresponds to underlying interlayer insulation film 3 in the first to sixth embodiments. Conductive plugs 44 and 62 are formed piercing interlayer insulation films 36 and 42, establishing conduction with conductive plug 34 that is conducting with the active region. Conductive plugs 44 and 62 are formed of an upper connection 62 and a lower connection 44, differing in material. However, the conductive plug may be formed of a single material.

An interlayer insulation film 48 is deposited on interlayer insulation film 46. A capacitor lower electrode 54 is formed so as to pierce interlayer insulation film 48 in the DRAM memory cell region. Capacitor lower electrode 54 establishes conduction with conductive plug 62 at its bottom. The metal film located at the boundary between the DRAM memory cell region and the DRAM peripheral circuit region is a guard ring. On capacitor lower electrode 54, an insulation film 56 such as a tantalum oxide film constituting a capacitor dielectric layer is stacked. On this dielectric film, a metal film 58 constituting the capacitor upper electrode is formed.

Even in the case where a metal type high dielectric film of high dielectric constant is employed for the capacitor insulation film and the capacitor lower electrode is oxidized by the oxidation process such as of ozone processing, the capacitance of the capacitor will not be reduced since the oxide is formed of a metal having conductivity. Although it is said that a capacitor lower electrode formed of such a metal has poor adherence to the interlayer insulation film, the problem of peel off can be prevented by restricting the metal film so as not to extend on the interlayer insulation film and to be equal to or lower in height than the top face of the interlayer insulation film. Furthermore, damage of the tubular metal film at the peripheral circuit region can be prevented by forming a tubular metal film in a concave configuration at the peripheral circuit region in the case where a cylindrical capacitor lower electrode is to be employed.

A method of fabricating the above semiconductor device will be described hereinafter.

Figure 19:
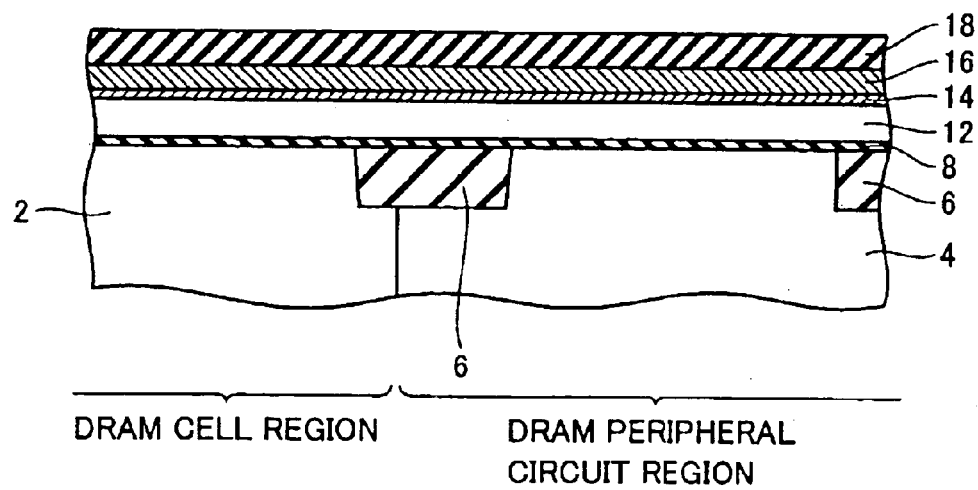
FIG. 19 is a sectional view of a DRAM according to a seventh embodiment of the present invention, corresponding to a state where a conductor layer functioning as a gate electrode is formed, and an insulation film is formed thereon by a fabrication method thereof.

Referring to FIG. 19, well implantation layer 2 is formed in the silicon substrate. Shallow trench isolation band 6 is formed at the boundary. Insulation film 8 corresponding to a gate insulation film is formed thereon. A polycrystalline silicon film 12 doped with impurities is grown on insulation film 12. On this polycrystalline silicon film 12, a refractory metal nitride film is grown, followed by deposition of silicon nitride film 18. In FIG. 19, the DRAM cell region corresponds to the capacitor region whereas the DRAM peripheral circuit region corresponds to the aforementioned peripheral region.

Figure 20:
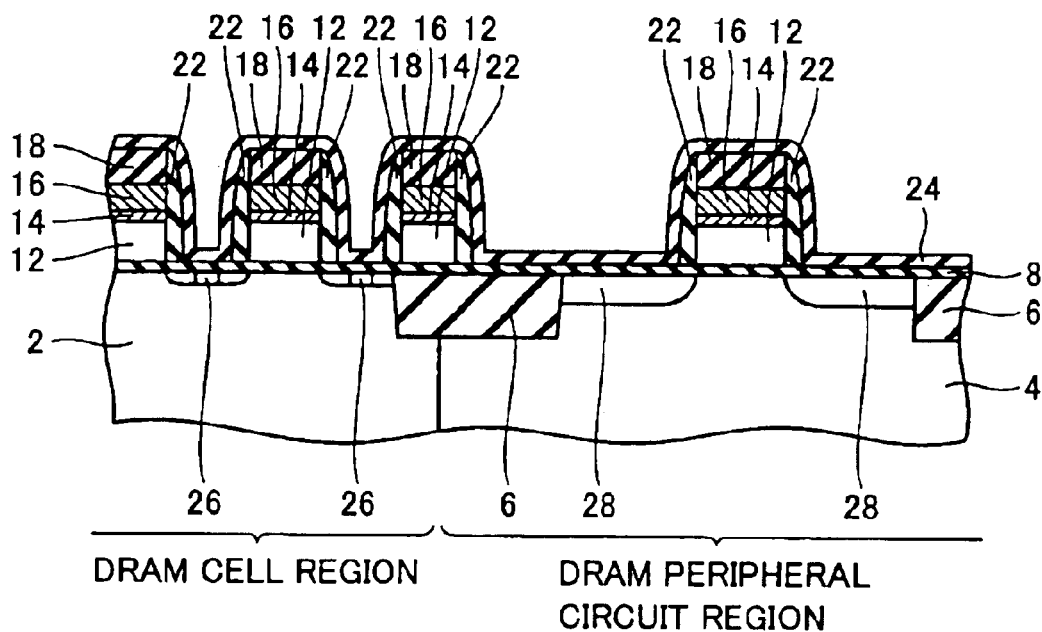
FIG. 20 is a sectional view of a semiconductor device corresponding to the state where a gate electrode is formed with an insulation film thereon.

Referring to FIG. 20, the layered film is subjected to photolithography and etching to remain at desired positions to form a gate electrode. Then, impurity layer 26 of low concentration is formed at the memory cell region, and sidewall 22 formed of a silicon nitride film is provided at the side face of the gate electrode in the peripheral circuit region. Then, impurity layer 28 of high concentration is formed. Finally, silicon nitride film 24 is vapor-deposited all over the wafer. For activation of impurities, annealing by RTA (Rapid Thermal Anneal) is conducted after formation of the implantation layer of high concentration.

Figure 21:
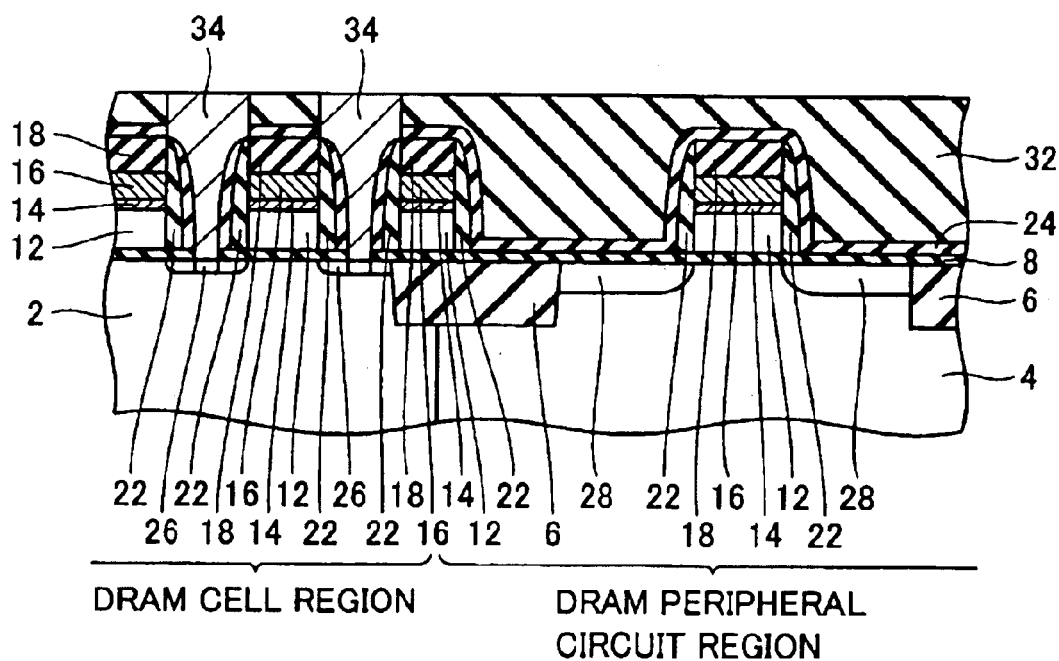
FIG. 21 is a sectional view of a semiconductor device corresponding to the state where an interlayer insulation film is formed, and then a conductive plug is formed.

Referring to FIG. 21, there is deposited an interlayer insulation film 32 formed of a silicon oxide film having boron or phosphorus doped all over the surface of the wafer, an application type silicon oxide film such as SOG, and an undoped silicon oxide film formed by CVD.

Then, an opening is formed so as to come into contact with the surface of the substrate by photolithography and etching at the desired position. This opening is filled with a conductive plug 34 as shown in FIG. 21. Specifically, polycrystalline silicon film 34 doped with impurities corresponding to the conductive plug is deposited all over the surface of the substrate to form contact therewith. The top face side is polished by etch-back or CMP to obtain conductive plug 34.

Figure 22:
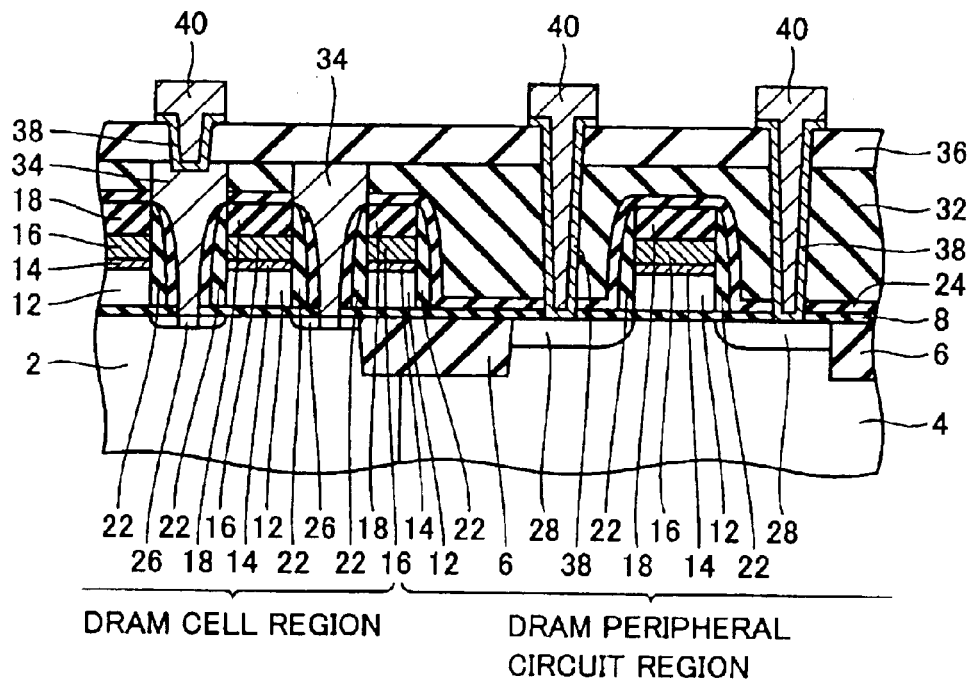
FIG. 22 is a sectional view of a semiconductor device corresponding to the state where an interlayer insulation film is further formed, and then a conductive plug is formed.

Referring to FIG. 22, interlayer insulation film 36 of a material identical to that of the interlayer insulation film is deposited all over the surface of the substrate. At desired locations in interlayer insulation film 36, an opening arriving at conductive plug 34 and an opening arriving at the surface of the silicon substrate are provided. These openings are filled with an interconnection layer that takes a layered structure of a metal film 40 such as of tungsten or copper and a barrier metal 38 such as of TiN or TaN.

Figure 23:
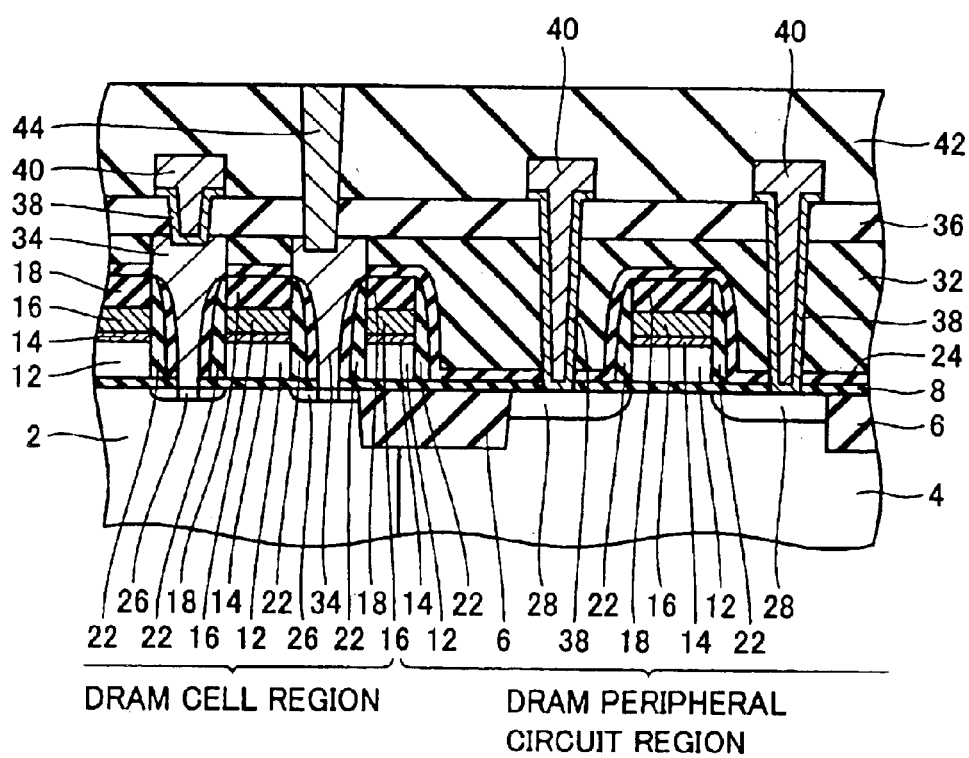
FIG. 23 is a sectional view of a semiconductor device corresponding to the state where an interlayer insulation film (underlying interlayer insulation film) is further formed, and then a conductive plug is formed.

Referring to FIG. 23, an interlayer insulation film 42 of a material identical to that of interlayer insulation film 32 is deposited all over the surface of the substrate. Then, an opening is formed at the desired location in interlayer insulation film 42 so as to establish contact with conductive plug 34. This interlayer insulation film corresponds to underlying interlayer insulation film 3 of the first to sixth embodiments.

The opening in interlayer insulation film 42 is filmed with a metal plug 44 formed of a refractory metal nitride film such as TaN or TiN. Metal plug 44 may have a double layered structure with a polysilicon lower connection, likewise the fifth embodiment.

Figure 24:
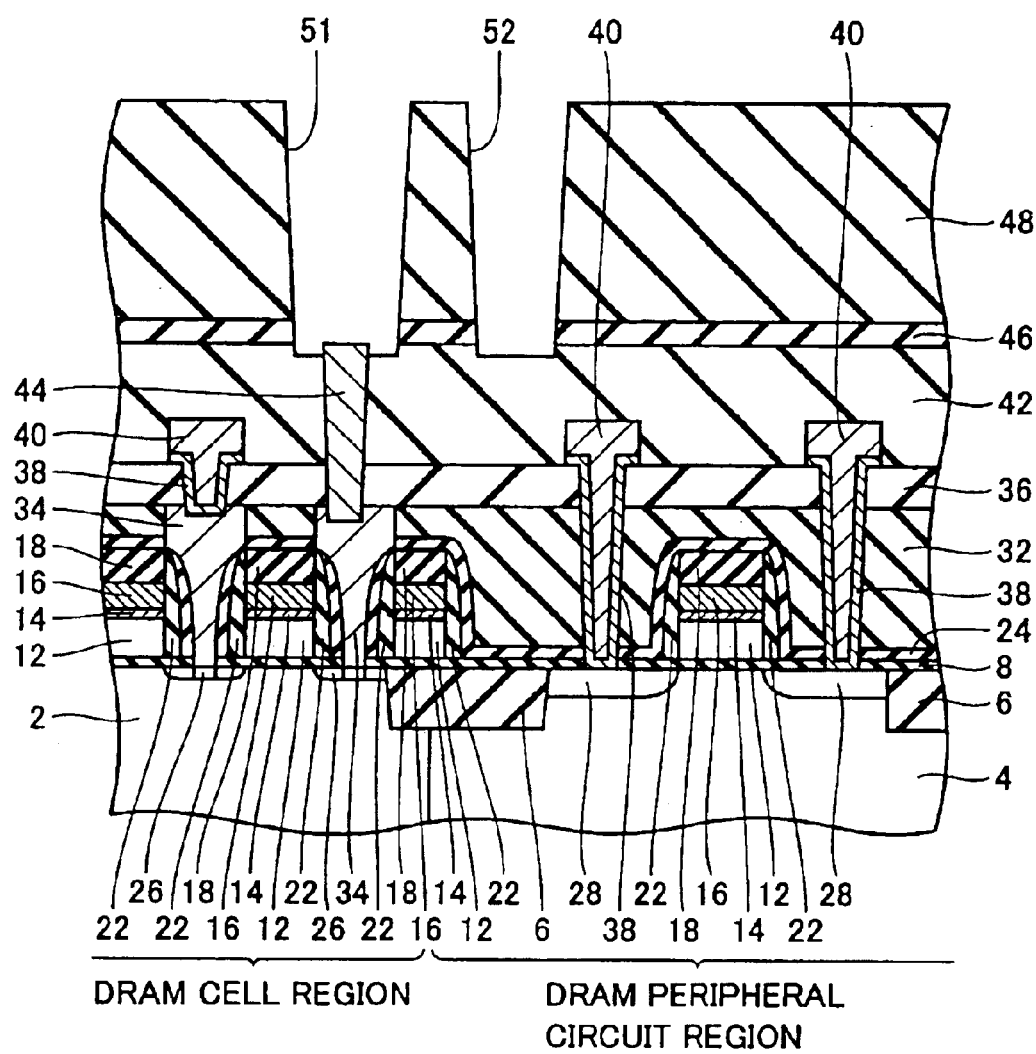
FIG. 24 is a sectional view of a semiconductor device corresponding to the state where an insulation film and an interlayer insulation film are formed, and then an opening is formed for the deposition of a tubular metal film.

Referring to FIG. 24, there are deposited silicon nitride film 46 and interlayer insulation film 48 of a material identical to that of interlayer insulation film 42 all over the surface of the silicon substrate. A hole pattern 51 for the capacitor low electrode and trench pattern 52 for the guard ring are formed at desired locations in silicon nitride film 46 and interlayer insulation film 48 so as to establish contact with conductive plug 44. Hole pattern 51 for the capacitor lower electrode is provided in the DRAM cell region. Pattern 52 for a guard ring is provided at the boundary between the DRAM cell region and the DRAM peripheral circuit region. Interlayer insulation film 48 corresponds to interlayer insulation film 7 of the first to sixth embodiments.

Figure 25:
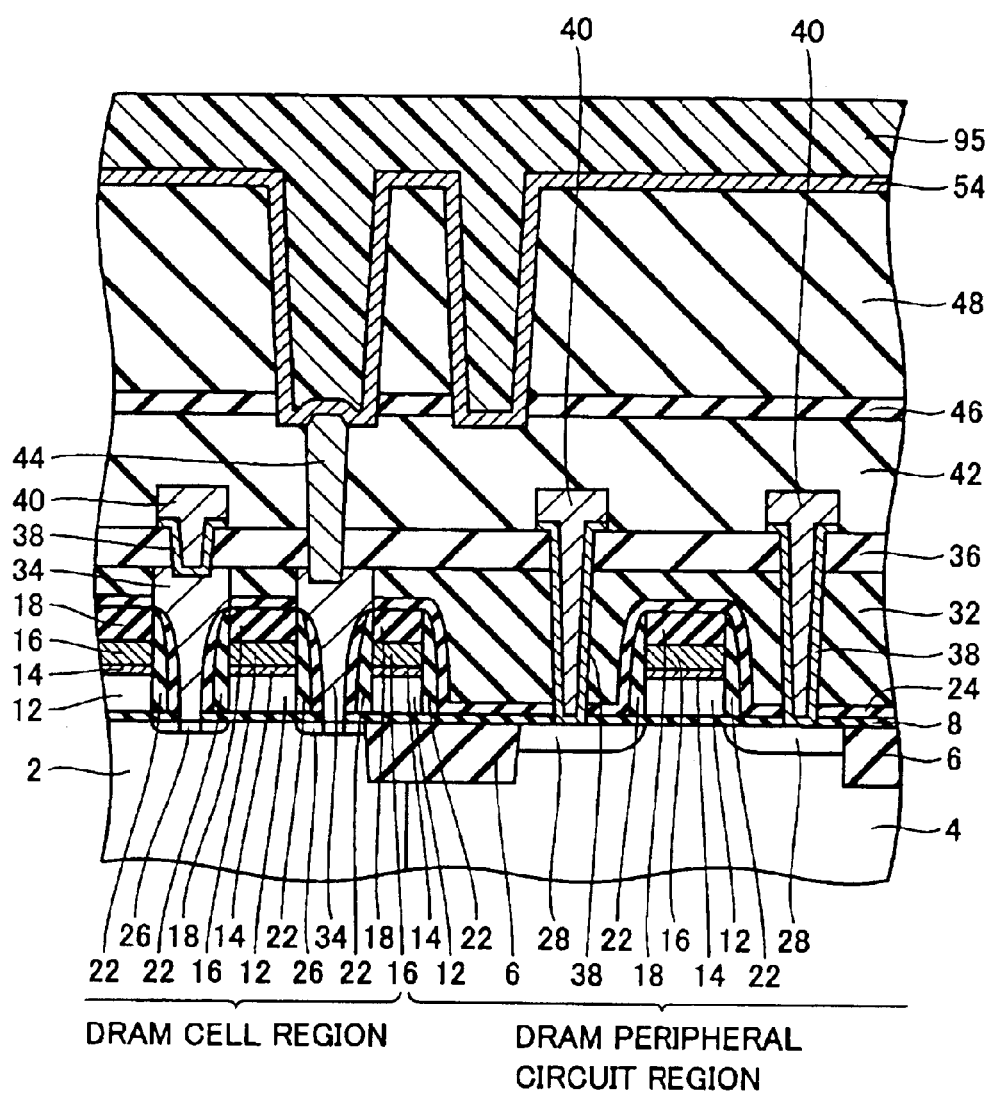
FIG. 25 is a sectional view of a semiconductor device corresponding to the state where a tubular metal film is formed, and a photoresist is applied thereover.
Figure 26:
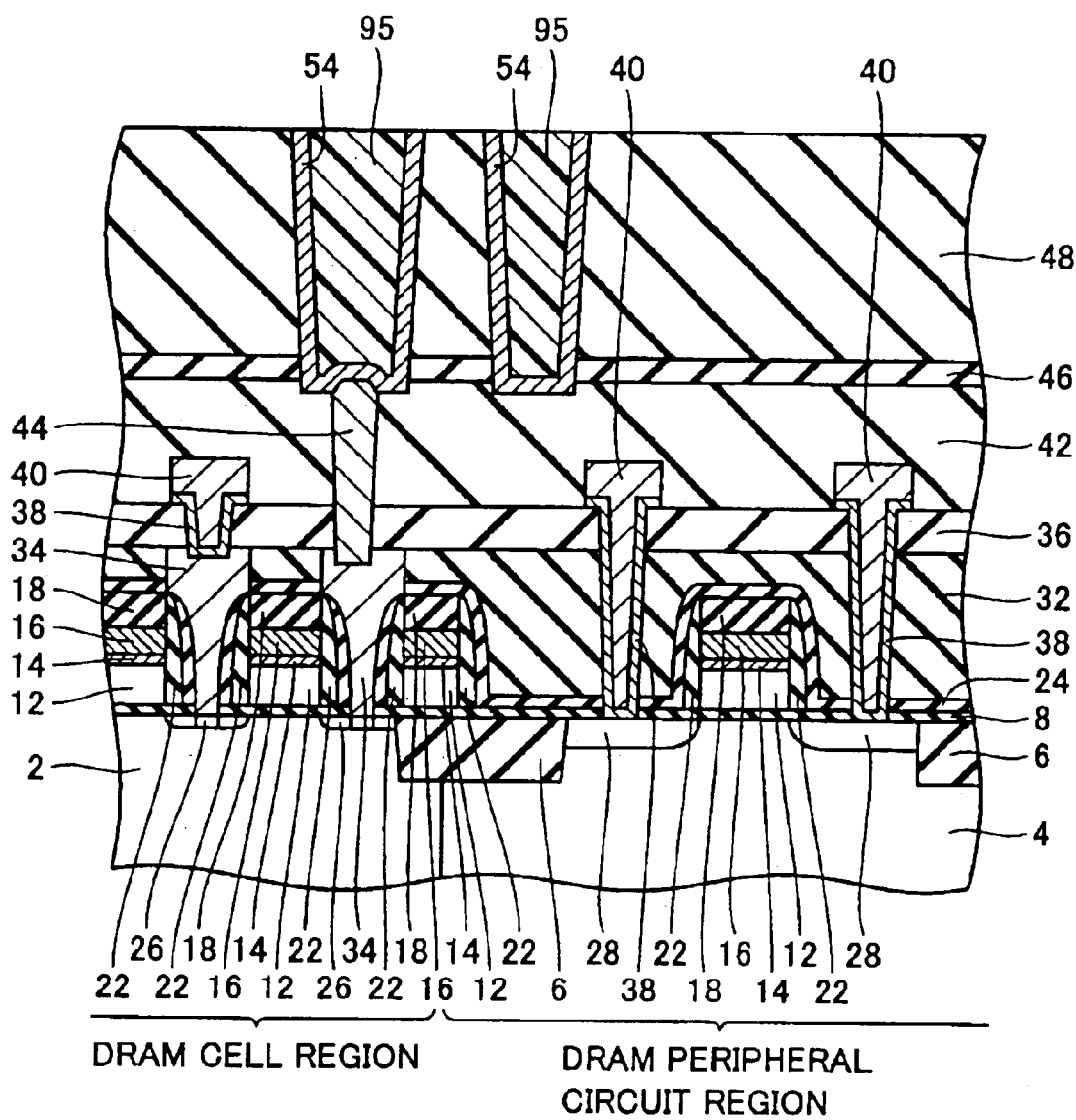
FIG. 26 is a sectional view of a semiconductor device corresponding to the state where the top face is polished by CMP.

Referring to FIGS. 25 and 26, noble metal such as ruthenium or platinum, refractory metal such as tungsten, or a layered film thereof is vapor-deposited on the surface of the substrate in which an opening is formed. Then, photoresist 95 is supplied all over the surface of the substrate. The top face is polished by CMP to form capacitor lower electrode 54 and guard ring 54.

Figure 27:
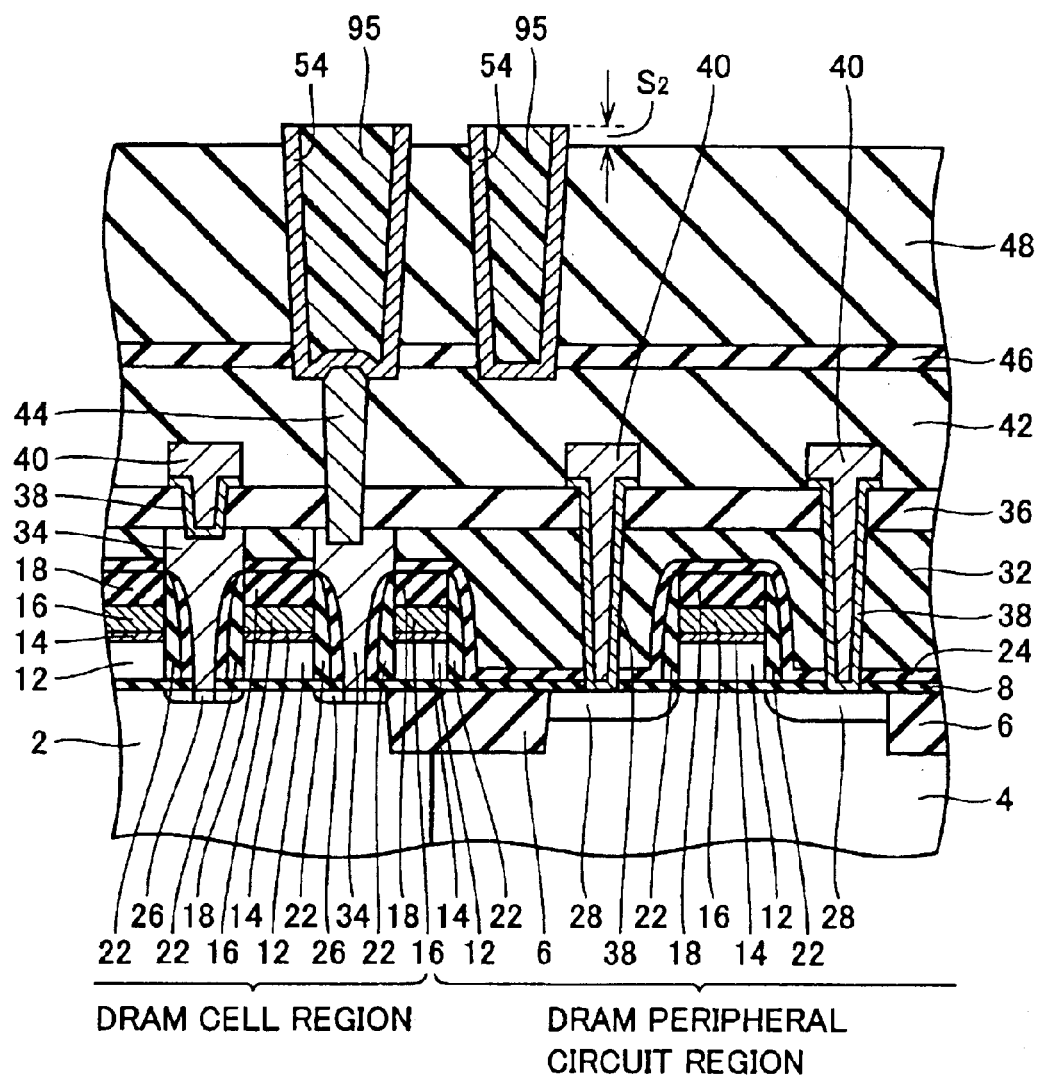
FIG. 27 is a sectional view of a semiconductor device corresponding to the state where the top face of the interlayer insulation film is set lower than the leading edge portion of the tubular metal film by etching back the entire surface.
Figure 28:
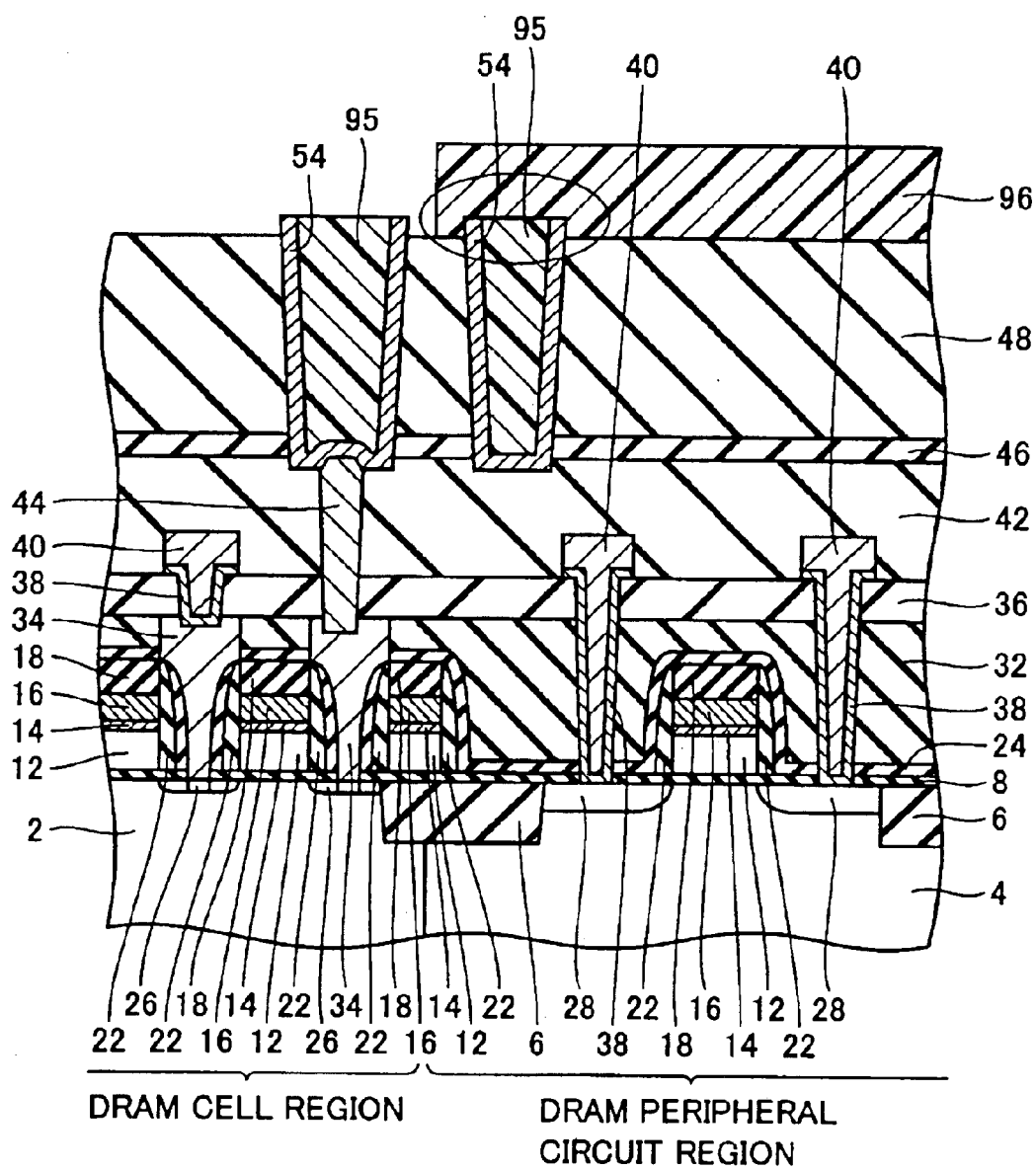
FIG. 28 is a sectional view a the semiconductor device corresponding to the state from FIG. 27 where a resist pattern is formed from the DRAM peripheral circuit region up to the guard ring.

Referring to FIGS. 27 and 28, the entire surface of interlayer insulation film 48 is etched back using an HF solution without a mask, whereby the top of capacitor lower electrode 54 and the top of the guard ring are set lower by S2 than the surface of interlayer insulation film 48. The dimension of S2 is preferably in the range of 50 nm to 100 nm, for example. By arranging the leading end of the guard ring so as to protrude from the interlayer insulation film by overall etch-back, the penetration into the peripheral circuit portion at the outer side of the guard ring during removal of the interlayer insulation film from the DRAM cell region with an HF solution can be suppressed, as described in the fourth embodiment. Then, the regions other than the DRAM cell region, for example, the peripheral circuit portion, TEG portion, mark portion, and the dicing line portion, are covered with resist pattern 96, as shown in FIG. 28.

Figure 29:
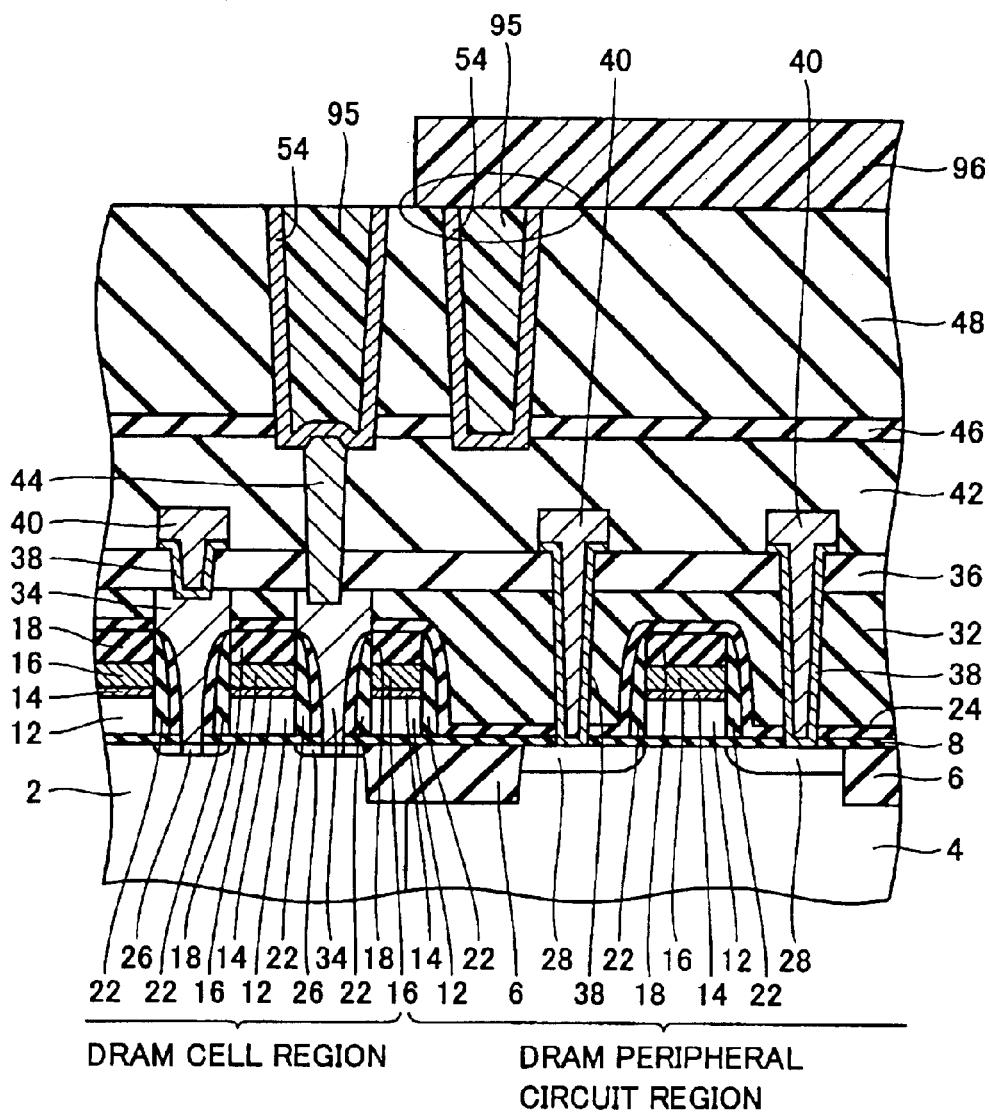
FIG. 29 is a sectional view of a semiconductor device corresponding to the state where a resist pattern is formed from the DRAM peripheral circuit region up to the guard ring without overall etch-back.
Figure 30:
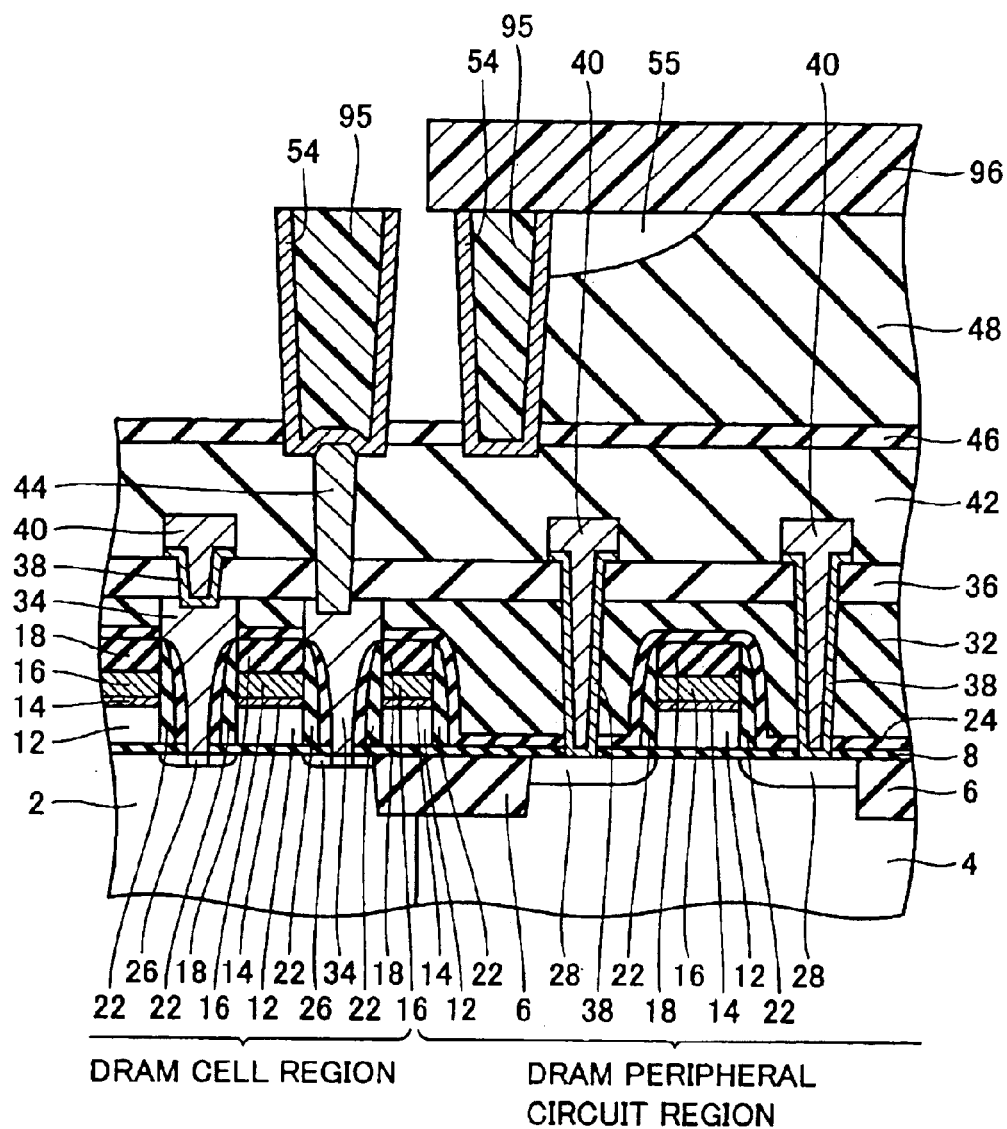
FIG. 30 is a sectional view of the semiconductor device corresponding to the state from FIG. 29 where the etchant employed for removal of the interlayer insulation film in the DRAM cell region permeates into the DRAM peripheral circuit region to etch away the interlayer insulation film in the DRAM peripheral circuit region.

FIGS. 29 and 30 correspond to the case where the above-described S2 is set to 0 without any overall etch-back. Referring to FIGS. 29 and 30, the interlayer insulation film in the DRAM cell region is removed using an HF solution or the like. Then, the photoresist is removed to form a capacitor lower electrode 54 of a circular cylindrical shape. It is to be noted that the etching solution such as HF will penetrate to produce an etched portion 55 in the interlayer insulation film in the DRAM peripheral circuit region, as shown in FIG. 30.

Figure 31:
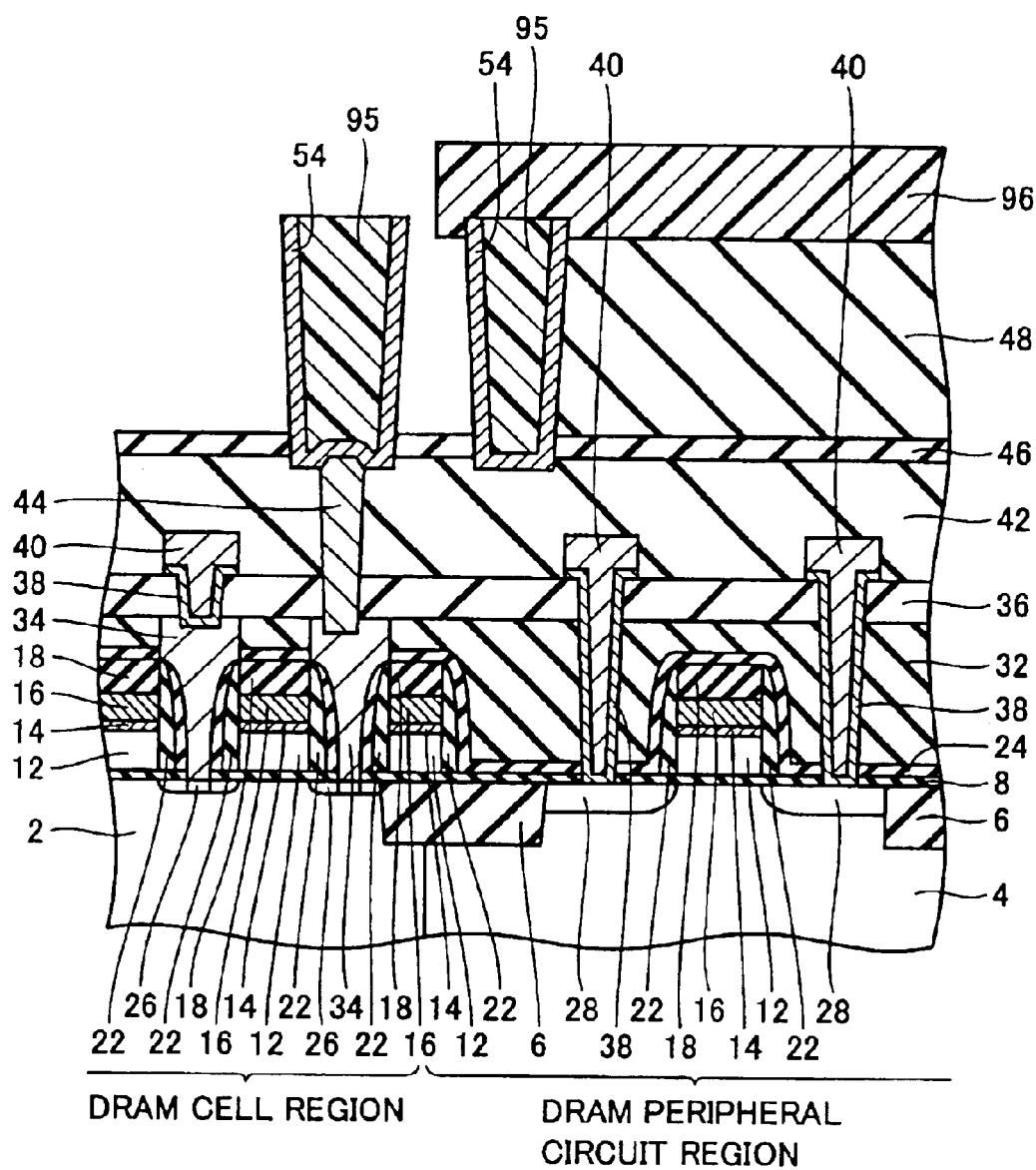
FIG. 31 is a sectional view of the semiconductor device corresponding to the state from FIG. 28 where the interlayer insulation film is selectively removed from the DRAM cell region.
Figure 32:
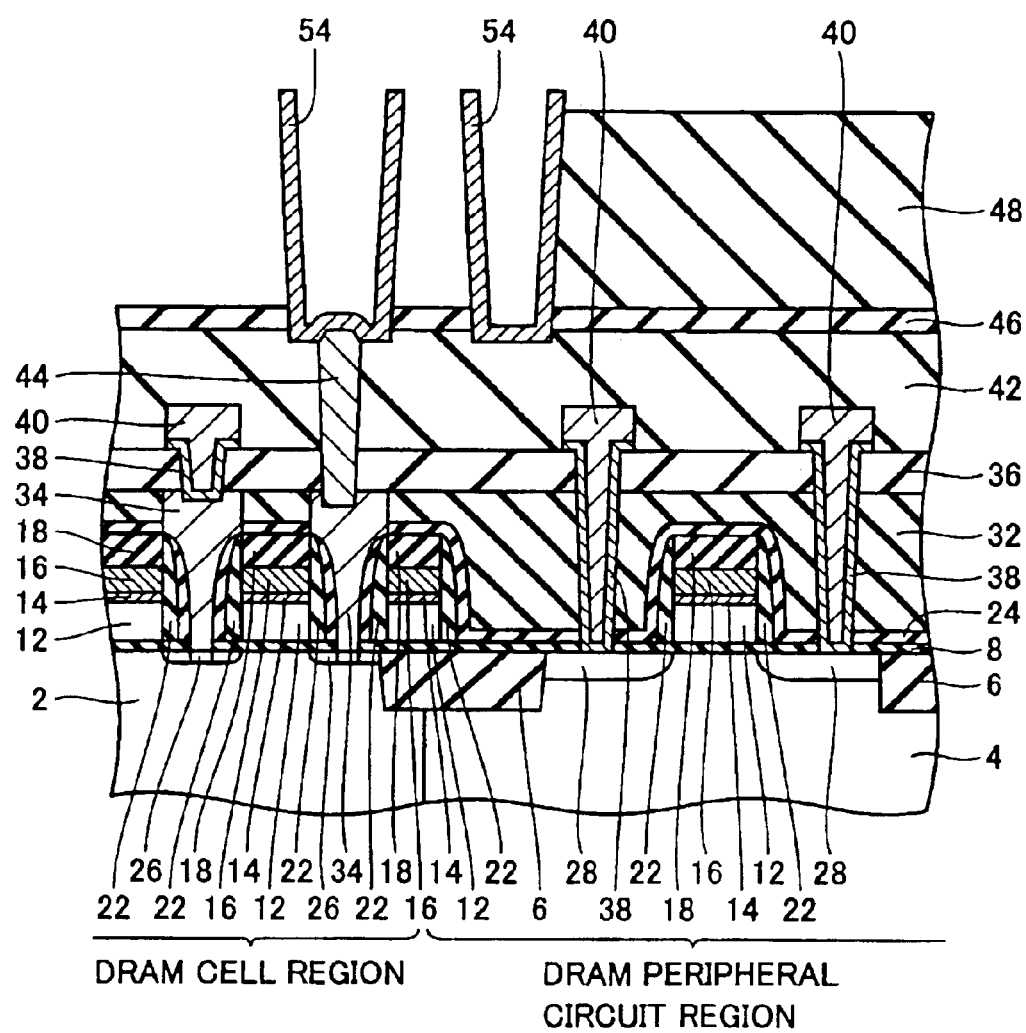
FIG. 32 is a sectional view of a semiconductor device corresponding to the state where the resist pattern is removed.

In contrast, FIGS. 31 and 32 correspond to the structure where etch-back is effected. Referring to FIGS. 31 and 32, the top face of the interlayer insulation film is set lower than the top of tubular metal film 54. Therefore, the aforementioned penetration can be prevented by virtue of the increase of the contacting area between the resist pattern and the top portion of the guard ring. FIG. 32 corresponds to the state where the resist pattern is removed from the DRAM peripheral circuit region after formation of the cylindrical capacitor lower electrode.

Figure 33:
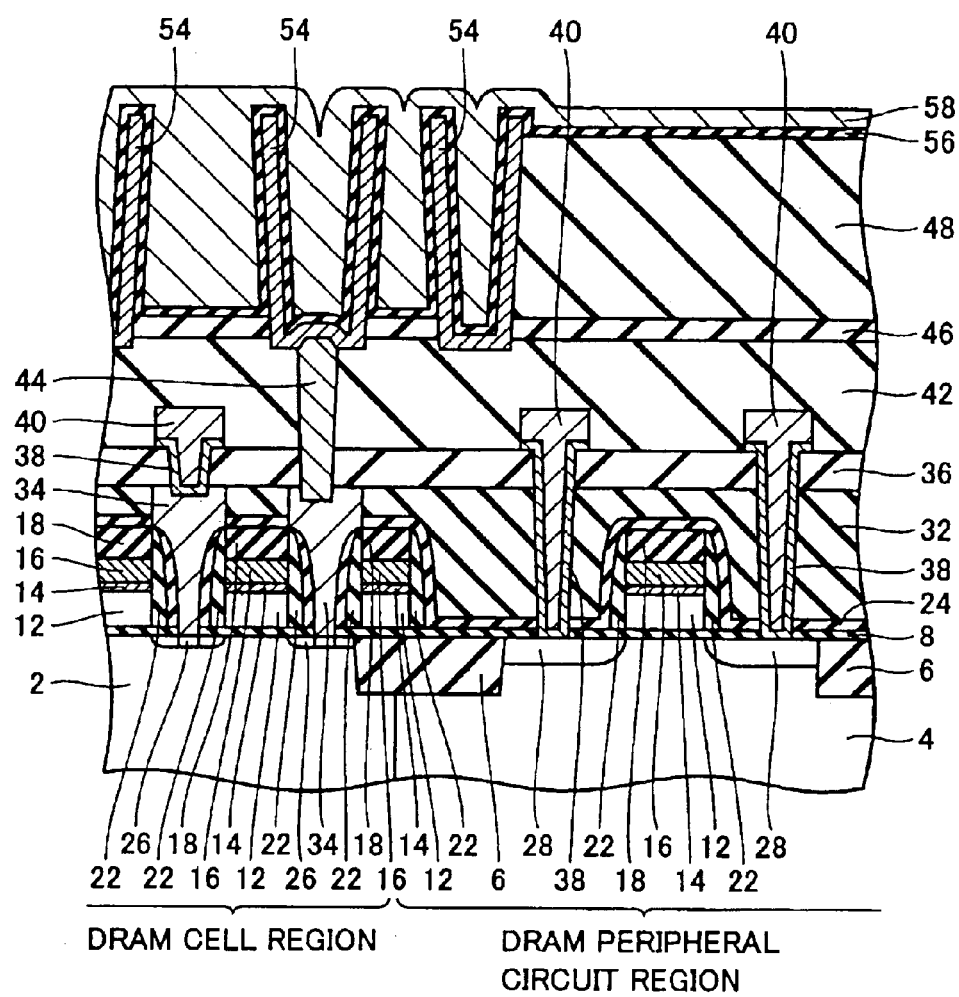
FIG. 33 is a sectional view of a semiconductor device corresponding to the state where a capacitor dielectric film is formed and a metal film for the upper electrode is formed.
Figure 34:
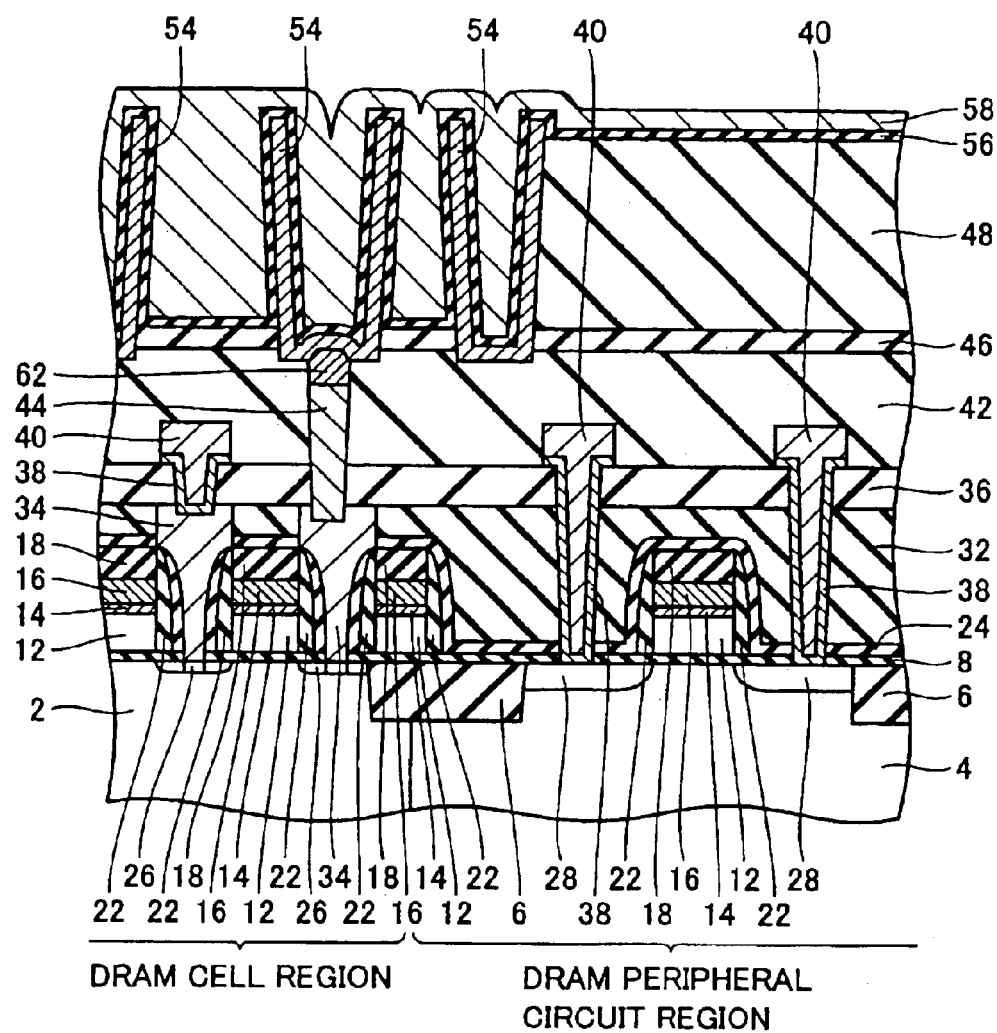
FIG. 34 is a sectional view of a semiconductor device which is a modification of the semiconductor device of FIG. 33, having the upper portion of the conductive plug in conduction with the capacitor lower electrode formed of a material of favorable adherence.

Referring to FIGS. 33 and 34, following formation of the capacitor lower electrode, a metal type high dielectric film such as TaO, TaNO, $Al_2O_3$, and BST (Barium Strontium Titanate) is deposited as capacitor insulation film 56. Then, an oxidation treatment for crystallization, i.e. oxidation by ozonation and annealing are conducted. Then, noble metal such as platinum or ruthenium, or refractory metal nitride such as TiN or TaN is vapor-deposited as upper electrode 58 to form a DRAM capacitor.

In FIG. 34, the conductive plug is divided into upper connection 62 and lower connection 44, formed of refractory metal nitride such as TiN having favorable adherence to capacitor lower electrode 54. By such a structure, the adherence to the capacitor lower electrode can be improved.

In the present embodiment, by carrying out etching using an etchant of the nitric acid type after applying a metal film such as of ruthenium and platinum corresponding to the upper or lower electrode by CVD as in the sixth embodiment, these metal films will not remain at the backside.

According to the above-described structure, the capacitance of the capacitor will not be reduced even in the case where a metal type dielectric film of a high dielectric constant is employed as the capacitor insulation film and the capacitor lower electrode is oxidized by oxidization such as ozonation since the oxide is formed of a metal having conductivity. Although it is said that a capacitor lower electrode formed of such metal has poor adherence to the interlayer insulation film and the like, peel off can be prevented by eliminating any metal film from the top plane of the interlayer insulation film and setting the height to be equal to or lower than the top plane of the interlayer insulation film. Also, damage of the tubular metal film in the peripheral circuit region can be prevented by employing a concave type tubular metal film at the peripheral circuit region when the capacitor lower electrode is formed in a cylindrical configuration.

Eighth Embodiment

Figure 35:
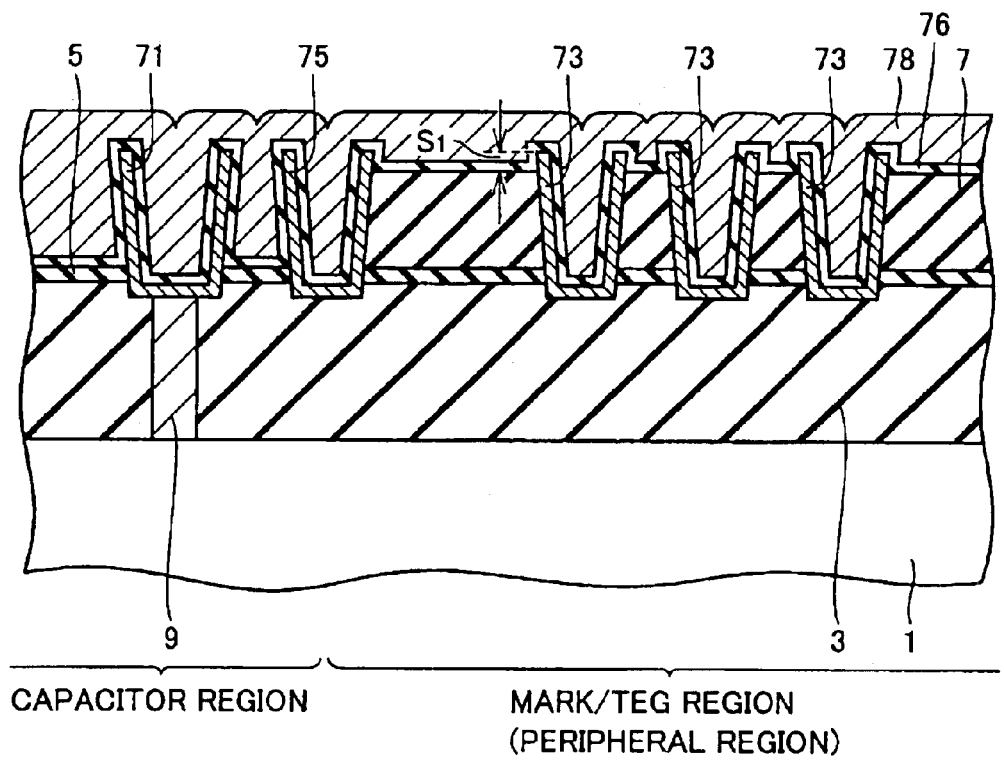
FIG. 35 shows a semiconductor device according to an eighth embodiment of the present invention.

FIG. 35 shows a semiconductor device according to an eighth embodiment of the present invention. Referring to FIG. 35, a capacitor lower electrode 71, a guard ring 75, an alignment mark 73 and the like are formed of polycrystalline silicon including impurities. On these tubular metal films, a dielectric film 76 is stacked. A metal film 78 corresponding to an upper electrode is deposited on dielectric film 76 at the capacitor region.

In FIG. 35, a guard ring is provided, and the top face of the interlayer insulation film is set lower than the top of the tubular metal film by S1. This structure corresponds to the MIM petal Insulator Metal) structure of the fourth embodiment applied to a MIS (Metal Insulator Semiconductor) structure, i.e. a structure employing polycrystalline silicon including impurities in the capacitor lower electrode. In the MIS structure, a semiconductor including impurities is employed for the capacitor lower electrode. Refractory metal nitride such as TaN or TiN, or refractory metal such as tungsten is employed for the upper electrode. A capacitor insulation film of a high dielectric constant such as TaO, TaON, or $Al_2O_3$ is employed for the capacitor insulation film.

By providing a guard ring with a step-graded portion S1 between the leading end of the guard ring and the top face of the interlayer insulation film in the peripheral region, penetration of the etching solution into the peripheral region during formation of a circular cylindrical capacitor lower electrode can be prevented.

Additional notes to the present invention

1. Although a semiconductor device corresponding to a DRAM was described in the seventh embodiment, the semiconductor device of the present invention is not limited to a DRAM. Any semiconductor device can be employed corresponding to the case where the capacitor lower electrode takes a tubular configuration.

2. In the above embodiments, noble metal such as Ru and Pt was cited as examples for the metal forming the tubular metal film. The material is not limited thereto, and refractory metal such as W may be employed. In addition to Ru and the like, any metal whose oxide has conductivity may be employed. In the formation of a tubular metal film by a double layer metal film, a TiN film has been cited as the underlying metal film. Such description is merely exemplary, and a film having favorable adherence to the tubular metal film such as a silicon oxide film or Ru can be employed. Metal nitride such as TiN is also referred to as a metal film.

3. The guard ring is formed in a trench configuration by removing the interlayer insulation film around the tubular conductive film in the capacitor region by wet etching. The guard ring is located at a position where penetration of the etching solution into the interlayer insulation film in the peripheral region is not feasible. However, the guard ring is not limited to a metal film extending along the inner plane of the trench as long as it takes the form of a division wall.

4. The upper connection of the plug interconnection is not limited to a TiN film. Any metal may be employed as long as it has favorable adherence to the metal such as Ru forming the capacitor lower electrode as well as conductivity.

5. When the capacitor lower electrode is formed using a semiconductor film including impurities such as a polycrystalline silicon film, the number of processing steps can be reduced by forming the guard ring with the same material. However, the material of the guard ring is not limited to a semiconductor film including impurities. The guard ring may be formed of another material, for example a metal film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed on a semiconductor substrate including a capacitor region and a peripheral region comprising:

an interlayer insulation film located above said semiconductor substrate; and a tubular metal film with a bottom end portion, having the bottom located at a lower side and an opening side located at an upper side so as to pierce said interlayer insulation film, and an underlying interlayer insulation film underlying said interlayer insulation film, wherein said underlying interlayer insulation film is composed of an upper underlying interlayer insulation film and a lower underlying interlayer insulation film that is thicker than said upper underlying interlayer insulation film and is located beneath said upper underlying interlayer insulation film, said bottom end portion of said tubular metal film penetrates said upper underlying interlayer insulation film and enters into said lower underlying interlayer insulation film so that a recess is made in an upper part of said lower underlying interlayer insulation film and said bottom end portion of said tubular metal film is in direct contact with side surfaces of said recess, and said opening side of said tubular metal film being formed only of a portion of said tubular metal film extending along a wall surface of a through hole where said tubular metal film is located.

2. The semiconductor device according to claim 1, wherein the opening end of said tubular metal film is in flush with the upper surface of said interlayer insulation film.

3. The semiconductor device according to claim 1, wherein said tubular metal film is formed of a layer of metal whose oxide has conductivity, or a plurality of metal layers selected from metals whose oxide has conductivity.

4. The semiconductor device according to claim 1, wherein said tubular metal film is formed of a double layer metal film including an underlying metal film in contact with said interlayer insulation film and an electrode metal film located on and in contact with said underlying metal film.

5. The semiconductor device according to claim 1, further comprising a capacitor region and a peripheral region that is peripheral to said capacitor region, wherein a dielectric film covering a tubular inner surface and an outer surface of said tubular metal film, and a metal film covering said dielectric film are arranged in said capacitor region, and said tubular metal film is located in a range equal to or below a top face of said interlayer insulation film, and has its tubular outer surface covered with said interlayer insulation film.

6. The semiconductor device according to claim 5, further comprising a guard ring piercing said interlayer insulation film, and extending so as to block said capacitor region from said peripheral region.

7. The semiconductor device according to claim 6, wherein a step-graded portion is present between a top of said guard ring and a top face of the interlayer insulation film in said peripheral region so that the top face of the interlayer insulation film in said peripheral region is located lower than the top of said guard ring.

8. The semiconductor device according to claim 1, wherein a plug interconnection piercing an underlying interlayer insulation film located below said interlayer insulation film, and establishing conduction between the bottom of said tubular metal film and a lower portion includes an upper connection in contact with the bottom of said tubular metal film and a lower connection formed of a material differing from the material of the upper connection, and continuously extending downwards from said upper connection.

9. The semiconductor device according to claim 1, wherein a metal film formed at the same processing step as said tubular metal film is absent at a backside of said semiconductor substrate.

10. The semiconductor device according to claim 1, said semiconductor device including a DRAM (Dynamic Random Access Memory), wherein a storage node in said DRAM is formed of said tubular metal film.

11. A semiconductor device formed on a semiconductor substrate, including a capacitor region and a peripheral region, said semiconductor device comprising:

an interlayer insulation film located above said semiconductor substrate and over both said capacitor region and said peripheral region;

a tubular impurity-containing semiconductor film with a bottom end portion, having the bottom located at a lower side and an opening side located at an upper side so as to pierce said interlayer insulation film at respective said capacitor region and peripheral region;

a plug interconnection piercing said interlayer insulation film and in electrical contact with the bottom end portion of said semiconductor film; and a guard ring piercing said interlayer insulation film, and extending so as to block said capacitor region from said peripheral region, wherein a plug is absent from a region beneath said guard ring, and a step-graded portion being present between a top of said guard ring and a top face of the interlayer insulation film in said peripheral region so that the top face of the interlayer insulation film in the peripheral region is located lower than the top of said guard ring.

12. The semiconductor device according to claim 11, said semiconductor device including a DRAM (Dynamic Random Access Memory), wherein a storage node of said DRAM is formed of said tubular impurity containing semiconductor film.

13. A semiconductor device formed on a semiconductor substrate including a capacitor region and a peripheral region, said semiconductor device comprising:

an interlayer insulation film located above said semiconductor substrate;

a tubular metal film with a bottom end portion, having the bottom located at a lower side and an opening side located at an upper side so as to pierce said interlayer insulation film;

a plug interconnection piercing said interlayer insulation film in electrical contact with part of the bottom end portion of the tubular metal film and with an underlying conductive region;

said opening side of said tubular metal film being formed only of a portion of said tubular metal film extending along a wall surface of a through hole where said tubular metal film is located; and a guard ring piercing said interlayer insulation film, and extending so as to block said capacitor region from said peripheral region, wherein a step-graded portion is present between a top of said guard ring and a top face of the interlayer insulation film in said peripheral region so that the top face of the interlayer insulation film in said peripheral region is located lower than the top of said guard ring.

* * * * *